(12) United States Patent
Yin et al.

(10) Patent No.: US 7,298,024 B2
(45) Date of Patent: Nov. 20, 2007

(54) TRANSPARENT AMORPHOUS CARBON STRUCTURE IN SEMICONDUCTOR DEVICES

(75) Inventors: Zhiping Yin, Boise, ID (US); David J. Williams, Meridian, ID (US); Weimin Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/458,642

(22) Filed: Jul. 19, 2006

(65) Prior Publication Data

US 2006/0244086 A1 Nov. 2, 2006

Related U.S. Application Data

(60) Division of application No. 10/789,736, filed on Feb. 27, 2004, now Pat. No. 7,220,683, which is a continuation-in-part of application No. 10/661,379, filed on Sep. 12, 2003, now Pat. No. 7,132,201.

(51) Int. Cl.
*H01L 23/58* (2006.01)

(52) U.S. Cl. ............................... 257/646; 257/E31.047

(58) Field of Classification Search ............... 257/298, 257/E21.024, 646, E31.047
See application file for complete search history.

(56) References Cited

U.S. PATENT DOCUMENTS

| 570,316 | A | 10/1896 | Le Blois et al. |
|---|---|---|---|
| H566 | H | 1/1989 | Nyaiesh et al. |
| 4,849,642 | A | 7/1989 | Katsumi |
| 4,971,853 | A | 11/1990 | Chaiken et al. |
| 4,975,144 | A | 12/1990 | Yamazaki et al. |
| 5,096,791 | A | 3/1992 | Yahalom |
| 5,198,263 | A | 3/1993 | Stafford et al. |
| 5,324,365 | A | 6/1994 | Niwa |
| 5,346,729 | A | 9/1994 | Pitts et al. |
| 5,358,880 | A | 10/1994 | Lebby et al. |
| 5,369,040 | A | 11/1994 | Halvis et al. |
| 5,420,043 | A | 5/1995 | Niwa |
| 5,431,800 | A | 7/1995 | Kirchhoff |
| 5,437,961 | A | 8/1995 | Yano et al. |

(Continued)

FOREIGN PATENT DOCUMENTS

EP 0531232 A2 3/1993

(Continued)

OTHER PUBLICATIONS

Lide, David R., ed., CRC Handbook of Chemistry and Physics, Internet Version 2005, http://www,hbcpnetbase.com, CRC Press, Boca Raton, FL, 2005, p. 12-157.*

(Continued)

*Primary Examiner*—Bradley K Smith
(74) *Attorney, Agent, or Firm*—Schwegman, Lundberg & Woessner, P.A.

(57) ABSTRACT

A transparent amorphous carbon layer is formed. The transparent amorphous carbon layer has a low absorption coefficient such that the amorphous carbon is transparent in visible light. The transparent amorphous carbon layer may be used in semiconductor devices for different purposes. The transparent amorphous carbon layer may be included in a final structure in semiconductor devices. The transparent amorphous carbon layer may also be used as a mask in an etching process during fabrication of semiconductor devices.

31 Claims, 19 Drawing Sheets

U.S. PATENT DOCUMENTS

| | | | |
|---|---|---|---|
| 5,470,661 A | 11/1995 | Bailey et al. | |
| 5,496,752 A | 3/1996 | Nasu et al. | |
| 5,514,885 A | 5/1996 | Myrick | |
| 5,578,501 A | 11/1996 | Niwa | |
| 5,589,307 A | 12/1996 | Takeuchi | |
| 5,629,532 A | 5/1997 | Myrick | |
| 5,669,644 A | 9/1997 | Kaihotsu et al. | |
| 5,723,029 A | 3/1998 | Shimoyama | |
| 5,733,713 A | 3/1998 | Yano et al. | |
| 5,750,316 A | 5/1998 | Kawamura et al. | |
| 5,800,878 A | 9/1998 | Yao | |
| 5,830,332 A | 11/1998 | Babich et al. | |
| 5,998,100 A | 12/1999 | Azuma | |
| 6,035,803 A | 3/2000 | Robles et al. | |
| 6,107,734 A | 8/2000 | Taneka et al. | |
| 6,128,700 A * | 10/2000 | Hsu et al. | 711/122 |
| 6,128,868 A | 10/2000 | Ohtsuka et al. | |
| 6,136,160 A | 10/2000 | Hrkut et al. | |
| 6,140,570 A | 10/2000 | Kariya | |
| 6,140,652 A | 10/2000 | Schlepr et al. | |
| 6,211,065 B1 | 4/2001 | Xi et al. | |
| 6,221,535 B1 | 4/2001 | Cox et al. | |
| 6,291,334 B1 | 9/2001 | Somekh | |
| 6,300,631 B1 | 10/2001 | Shofner | |
| 6,313,896 B1 | 11/2001 | Samant et al. | |
| 6,316,329 B1 | 11/2001 | Hirota et al. | |
| 6,323,119 B1 | 11/2001 | Xi et al. | |
| 6,331,380 B1 | 12/2001 | Ye et al. | |
| 6,346,184 B1 | 2/2002 | Sano et al. | |
| 6,350,997 B1 | 2/2002 | Saeki | |
| 6,394,109 B1 | 5/2002 | Somekh | |
| 6,420,095 B1 | 7/2002 | Kawamura et al. | |
| 6,423,384 B1 | 7/2002 | Khazeni et al. | |
| 6,427,703 B1 | 8/2002 | Somekh | |
| 6,444,899 B2 | 9/2002 | Kubota et al. | |
| 6,447,891 B1 | 9/2002 | Veerasamy et al. | |
| 6,461,950 B2 | 10/2002 | Yin et al. | |
| 6,483,127 B2 | 11/2002 | Saeki | |
| 6,508,911 B1 | 1/2003 | Han et al. | |
| 6,541,397 B1 | 4/2003 | Bencher | |
| 6,551,941 B1 | 4/2003 | Yang et al. | |
| 6,566,757 B1 | 5/2003 | Banerjee et al. | |
| 6,583,481 B2 | 6/2003 | Itoh | |
| 6,613,603 B1 | 9/2003 | Sano | |
| 6,621,535 B1 | 9/2003 | Fukada | |
| 6,624,064 B1 | 9/2003 | Sahin et al. | |
| 6,627,532 B1 | 9/2003 | Gaillard et al. | |
| 6,649,469 B1 | 11/2003 | Wilson | |
| 6,653,735 B1 | 11/2003 | Yang et al. | |
| 6,668,752 B2 | 12/2003 | Yao | |
| 6,780,753 B2 | 8/2004 | Latchford et al. | |
| 6,784,119 B2 | 8/2004 | Gaillard et al. | |
| 6,795,636 B1 | 9/2004 | Cronk et al. | |
| 6,803,313 B2 | 10/2004 | Gao et al. | |
| 6,821,571 B2 | 11/2004 | Huang | |
| 6,825,114 B1 | 11/2004 | Fisher et al. | |
| 6,841,341 B2 * | 1/2005 | Fairbairn et al. | 430/323 |
| 6,852,647 B2 | 2/2005 | Bencher | |
| 6,864,556 B1 | 3/2005 | You et al. | |
| 6,875,664 B1 | 4/2005 | Huang et al. | |
| 6,875,687 B1 | 4/2005 | Weidman | |
| 6,884,733 B1 | 4/2005 | Dakshina-Murthy et al. | |
| 7,129,180 B2 | 10/2006 | Sandhu et al. | |
| 7,132,201 B2 | 11/2006 | Yin et al. | |
| 2001/0006837 A1 | 7/2001 | Kwon et al. | |
| 2001/0011730 A1 | 8/2001 | Saeki | |
| 2001/0017153 A1 | 8/2001 | Kubota et al. | |
| 2001/0035551 A1 * | 11/2001 | Kotecki et al. | 257/306 |
| 2002/0001778 A1 | 1/2002 | Latchford et al. | |
| 2002/0003239 A1 | 1/2002 | Ramdani et al. | |
| 2002/0086547 A1 | 7/2002 | Mui et al. | |
| 2002/0100696 A1 | 8/2002 | Sano et al. | |
| 2003/0198814 A1 | 10/2003 | Khieu et al. | |
| 2003/0207207 A1 | 11/2003 | Li | |
| 2004/0092098 A1 * | 5/2004 | Sudijono et al. | 438/637 |
| 2005/0056835 A1 | 3/2005 | Yin et al. | |
| 2005/0056940 A1 | 3/2005 | Sandhu et al. | |
| 2006/0001175 A1 | 1/2006 | Sandhu | |
| 2006/0003237 A1 | 1/2006 | Yin et al. | |
| 2006/0008741 A1 | 1/2006 | Yin et al. | |
| 2006/0022247 A1 | 2/2006 | Yin et al. | |

FOREIGN PATENT DOCUMENTS

| | | |
|---|---|---|
| JP | 58-204534 A | 11/1983 |
| WO | WO-03038875 A2 | 5/2003 |
| WO | WO-04012246 A2 | 2/2004 |
| WO | WO-05034216 A1 | 4/2005 |
| WO | WO-05034229 A1 | 4/2005 |

OTHER PUBLICATIONS

He et aL, Characterization and optical properties of diamondlike carbon prepared by electron cyclotron resonance plasma, J. Mater. Res., 14(3) (Mar. 1999) 1055.*

Zhou et aL, Deposition and properties of a-C:H films on polymethyl methacrylate by electron cyclotron resonance microwave plasma chemical vapor deposition method, Surface and Coatings Technology, 123 (2000) 273.*

Chen et aL, Optical constants of tetrahedral amorphous carbon films in the infrared region and at a wavelength of 633 nm, J. AppL Phys., 87(9) (May 2000) 4268.*

Liu, W., et al., "Generating Sub-30nm Poly-Silicon Gates Using PECVD Amorphous Carbon as Hardmask and Anti-Reflective Coating", *Proceedings of the SPIE, 5040*, Optical Microlithography XVI, Yen, A, (ed.),(Feb. 25, 2003),841-848.

Pelton, Matthew, et al., "The optical absorption edge of diamond-like carbon: A quantum well model", *Journal of Applied Physics, 83(2)*, (Jan. 15, 1998), 1029-35.

Shieh, J. -., et al., "Characteristics of Fluorinated Amorphous Carbon Films and Implementation of 0.15 micron Cu/a-C:F Damascene Interconnection", *Journal of Vacuum Science and Technology, 19*, (May 2001),780-787.

* cited by examiner

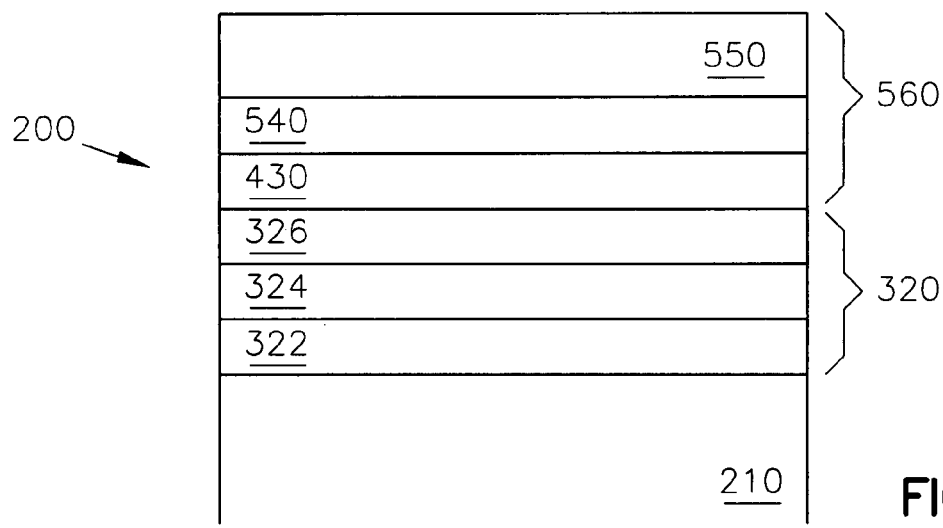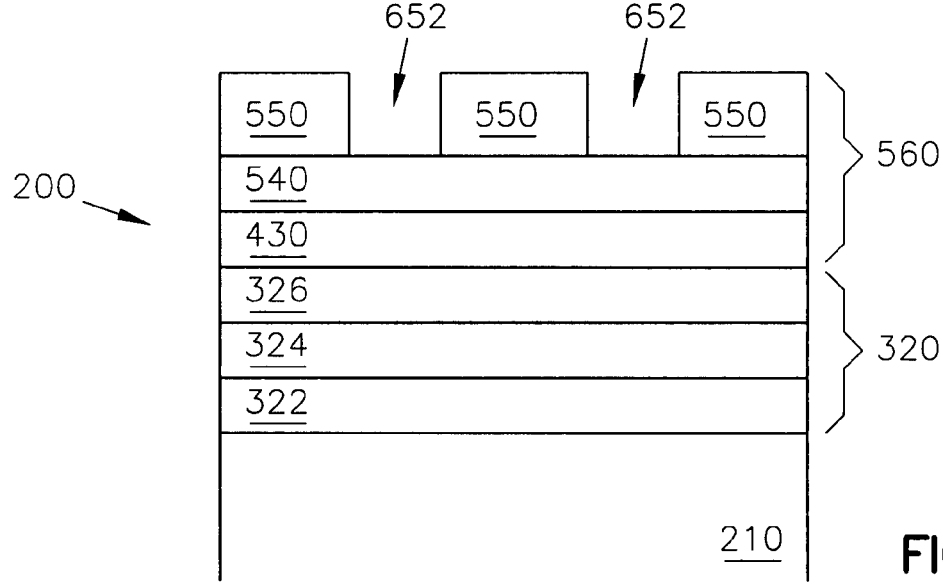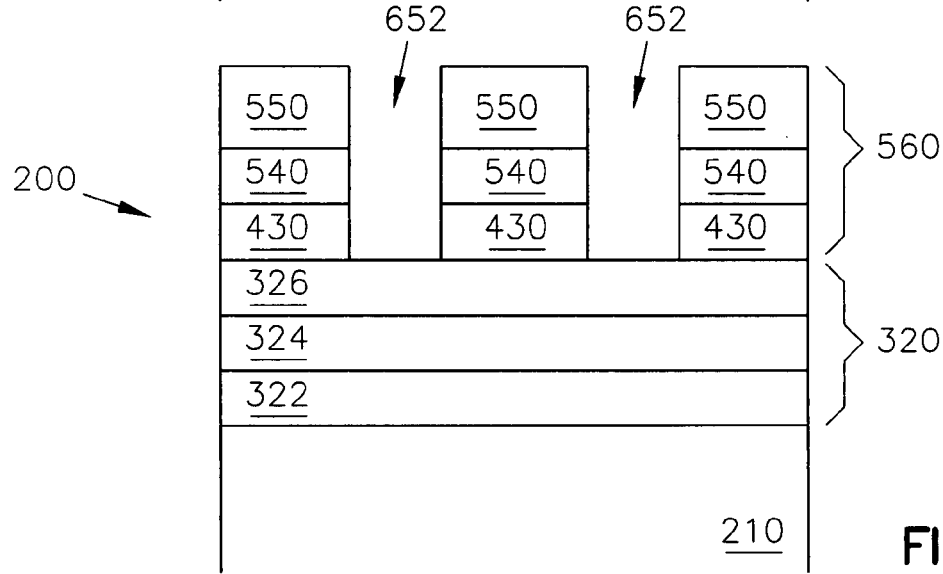

TRANSPARENT AMORPHOUS CARBON STRUCTURE IN SEMICONDUCTOR DEVICES

This application is a Divisional of U.S. application Ser. No. 10/789,736, filed on Feb. 27, 2004 now U.S Pat No. 7,220,683, which is a Continuation-In-Part application of co-pending and commonly assigned application, Ser. No. 10/661,379, filed on 12 Sep. 2003 now U.S Pat No. 7,132,201, which applications are hereby incorporated by reference.

RELATED APPLICATIONS

This application is related to the following co-pending and commonly assigned application, application Ser. No. 10/661,100, entitled "MASKING STRUCTURE HAVING MULTIPLE LAYERS INCLUDING AN AMORPHOUS CARBON LAYER," filed 12 Sep. 2003, which is hereby incorporated by reference.

FIELD OF INVENTION

The present invention relates generally to semiconductor devices, more particularly to masking structures in the semiconductor devices.

BACKGROUND

Semiconductor devices such as memory devices reside in many computers and electronic products to store data. A typical semiconductor device has many layers of different materials formed on a semiconductor wafer.

During manufacturing, the layers go through many processes. For example, a patterning process puts patterns on the layers. Some patterning processes use a mask to transfer patterns from the mask to the layers underneath the mask.

Some conventional masks are made of amorphous carbon. However, an amorphous carbon mask at some thickness may have a high absorption of optical light, causing the amorphous carbon mask inapplicable for some processes.

BRIEF DESCRIPTION OF THE DRAWINGS

FIG. 2 through FIG. 10 show cross-sections of a device during various processing stages according to embodiments of the invention.

DETAILED DESCRIPTION OF THE EMBODIMENTS

Figure 1A:
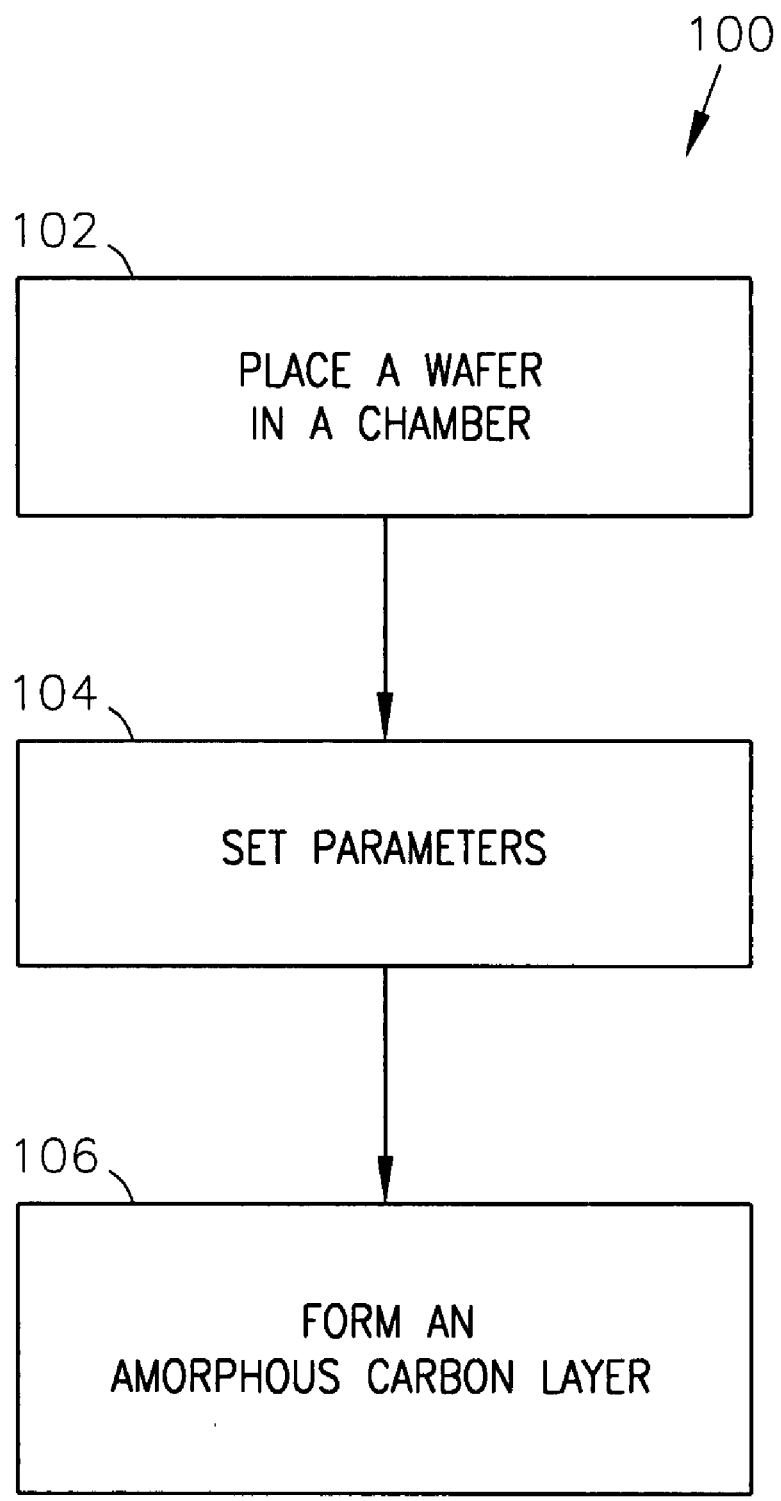
FIG. 1A is a flow chart showing a method of forming an amorphous carbon layer according an embodiment of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The various embodiments disclosed herein are not necessarily mutually exclusive, as some disclosed embodiments can be combined with one or more other disclosed embodiments to form new embodiments. The scope of the invention encompasses the full ambit of the claims and all available equivalents.

FIG. 1A is flowchart showing a method of forming an amorphous carbon layer according to an embodiment of the invention. Method 100 forms an amorphous carbon layer having a low absorption coefficient such that the amorphous carbon layer is transparent in visible light range.

The visible light range is the range (optical range) of the electromagnetic spectrum having light (electromagnetic radiation) visible to human eyes. The visible light range includes any light having a wavelength between about 400 nm (nanometers) and about 700 nm. The non-visible light range is the range of the entire electromagnetic spectrum minus the visible light range. Some examples of the non-visible light range include electromagnetic radiations with wavelengths between 700 nm and one millimeter (infrared light), wavelengths between 10 nm and 400 nm (ultraviolet light), and wavelengths between 0.01 nm and 10 nm (X-ray).

In this specification, the amorphous carbon layer is transparent in visible light range means that the amorphous carbon layer has a substantially low extinction coefficient (k) in which k has a range between about 0.15 and about 0.001 at wavelength of 633 nm. In some embodiments, the amorphous carbon layer transparent in visible light range is an amorphous carbon layer formed at a temperature from about 150° C. to about 500° C. such that the amorphous carbon layer has an extinction coefficient (k) between about 0.15 and about 0.001 at wavelength of 633 nm.

At box 102 of method 100 in FIG. 1A, a wafer is placed in a chamber. In some embodiments, the chamber is a chemical vapor deposition chamber and the wafer is a semiconductor wafer. In embodiments represented by FIG. 1A, the chamber is a plasma enhanced chemical vapor deposition (PECVD) chamber.

At box 104, the parameters are set for the process of forming an amorphous carbon layer according to the invention. The parameters include temperature, gas mixture, gas flow rate, power, and pressure. The temperature in the chamber is set to a selected temperature. The selected temperature is any temperature from about 150° C. to about 500° C. In some embodiments, the temperature is set between about 200° C. and below 300° C. In other embodiments, the temperature is set between about 225° C. and about 375° C.

In the process of forming an amorphous carbon layer, a process gas including propylene ($C_3H_6$) is introduced into the chamber at a flow rate. In some embodiments, the flow rate of the propylene is set between about 500 standard cubic centimeters per minute (sccm) and about 3000 sccm. An additional gas including helium may be also introduced into the chamber at a flow rate. In some embodiments, the flow rate of the helium is set between about 250 sccm and about 1000 sccm. Further, embodiments exist where at least one of the other hydrocarbon gases is used as the process gas. Examples of the other hydrocarbon gases include $CH_4$, $C_2H_2$, $C_2H_4$, $C_2H_6$, and $C_3H_8$. Helium may also be used in combination with at least one of these hydrocarbon gases. Thus, in box 104, a gas mixture is introduced into the chamber.

In this specification, the gas mixture may be either one gas only or a combination of at least two gases. For example, the gas mixture may be either propylene ($C_3H_6$) only or a combination of propylene and helium. As another example, the gas mixture may be at least one of the propylene, $CH_4$, $C_2H_2$, $C_2H_4$, $C_2H_6$, and $C_3H_8$. As a further example, the gas mixture may be at least one of the propylene, $CH_4$, $C_2H_2$, $C_2H_4$, $C_2H_6$, and $C_3H_8$ plus helium.

During the process of forming the amorphous carbon layer in method 100, the chamber is subjected to a radio frequency (RF) power and a pressure. In some embodiments, the radio frequency power is set between about 450 Watts and about 1000 Watts, and the pressure is set between about 3.0 Torr and about 7.0 Torr.

In box 106, an amorphous carbon layer is formed as a deposited layer over the wafer. The amorphous carbon layer is transparent in visible light range. In some embodiments, the amorphous carbon layer formed by method 100 has an extinction coefficient (k) between about 0.15 and about 0.001 at wavelength of 633 nm.

Since the amorphous carbon layer formed by method 100 is transparent in visible light range, the amorphous carbon layer formed by method 100 is also referred to as a transparent amorphous carbon layer. Thus, the transparent amorphous carbon layer refers to an amorphous carbon layer formed according method 100 in which the temperature is set from about 150° C. to about 500° C.

The transparency of the amorphous carbon layer formed by method 100 depends in part on the temperature set during the process. In method 100, the transparency of the amorphous carbon layer formed to a specific thickness at a lower temperature is more transparent than the amorphous carbon layer formed to that specific thickness at a higher temperature. For example, in method 100, the amorphous carbon layer formed to a thickness at 150° C. is more transparent than the amorphous carbon layer formed to the same thickness at 500° C.

The transparent amorphous carbon layer formed by method 100 may be used in semiconductor devices such as memory devices and microprocessors. For example, the transparent amorphous carbon layer formed by method 100 may be included in a structure of semiconductor devices as an insulating layer or an antireflective layer. As another example, the transparent amorphous carbon layer formed by method 100 may also be used as a mask in an etching process during manufacturing of semiconductor devices.

Figure 1B:
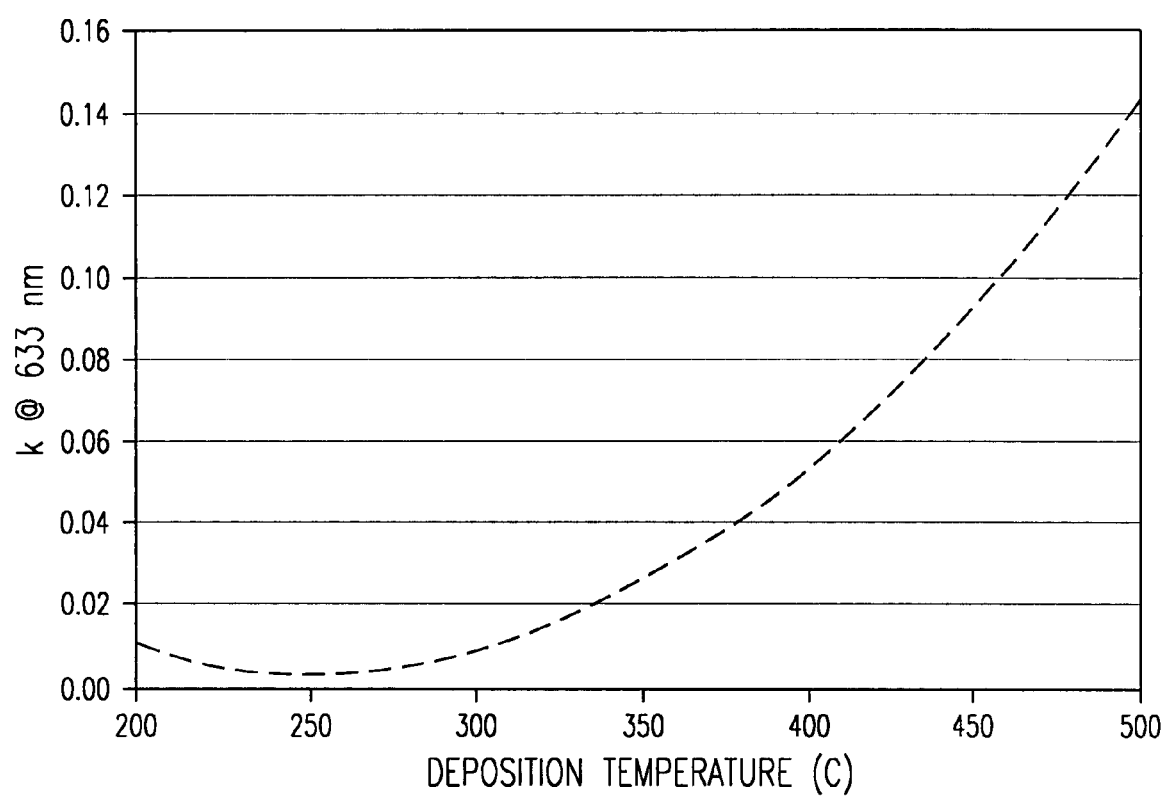
FIG. 1B is graph showing an extinction coefficient (k) at an exemplary wavelength versus deposition temperature of a transparent amorphous carbon layer according to an embodiment of the invention.

FIG. 1B is graph showing extinction coefficient (k) at an exemplary wavelength versus deposition temperature of a transparent amorphous carbon layer according to an embodiment of the invention. In some embodiments, the graph of FIG. 1B shows the extinction coefficient of the transparent amorphous carbon layer formed according to the method described in FIG. 1A.

In FIG. 1B, curve 150 shows the transparent amorphous layer having an extinction coefficient k ranging from about 0.15 to about 0.001 at wavelength of 633 nm when the transparent amorphous layer is formed (or deposited) at a temperature from about 150° C. to about 500° C. In FIG. 1B, curve 150 has an exemplary shape. In some embodiments, curve 150 may have a shape different from the shape shown in FIG. 1B.

Figure 1C:
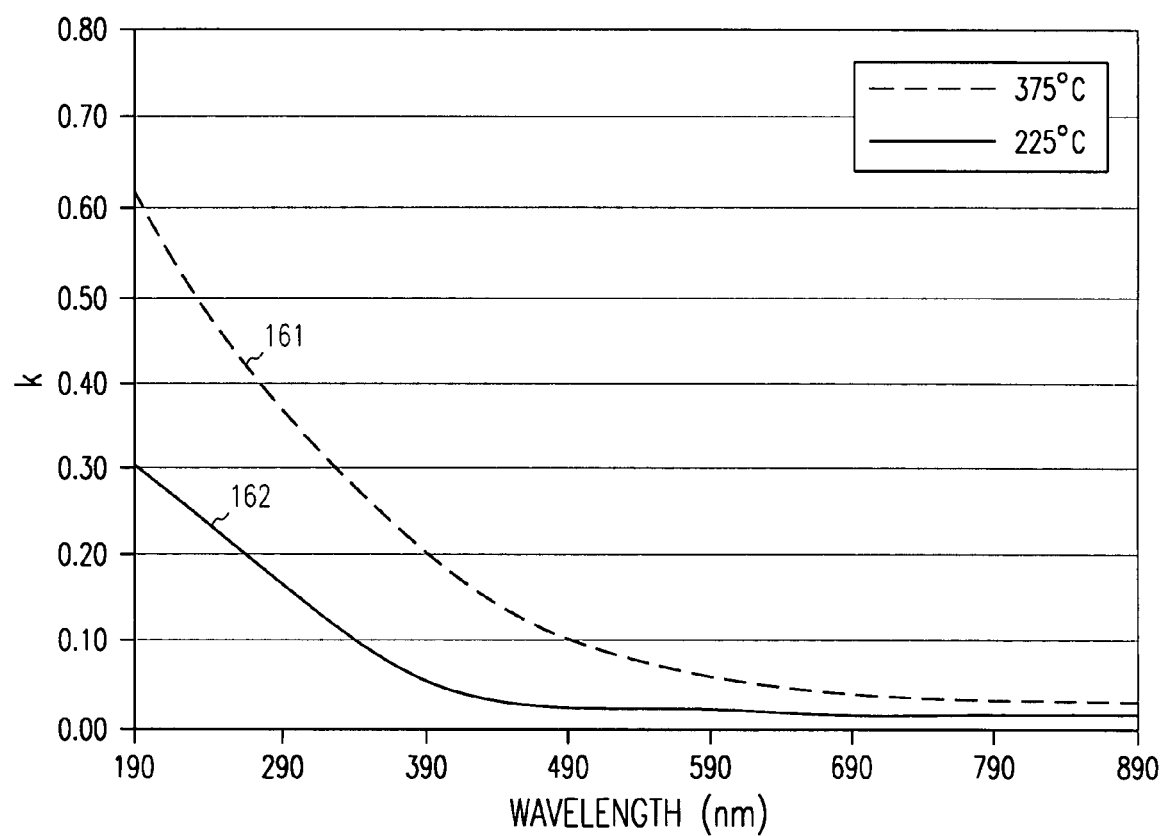
FIG. 1C is graph showing an extinction coefficient (k) at exemplary temperatures versus range of wavelengths of a transparent amorphous carbon according to an embodiment of the invention.

FIG. 1C is graph showing extinction coefficient (k) at exemplary temperatures versus a range of wavelengths of a transparent amorphous carbon according to an embodiment of the invention. In some embodiments, the graph of FIG. 1C shows the extinction coefficient of the transparent amorphous carbon layer formed according to the method described in FIG. 1A.

In FIG. 1C, curve 161 shows extinction coefficient (k) versus a range of wavelengths of a transparent amorphous carbon formed at an exemplary temperature of 375° C. Curve 162 shows extinction coefficient versus a range of wavelengths of another transparent amorphous carbon formed at an exemplary temperature of 225° C.

Figure 1D:
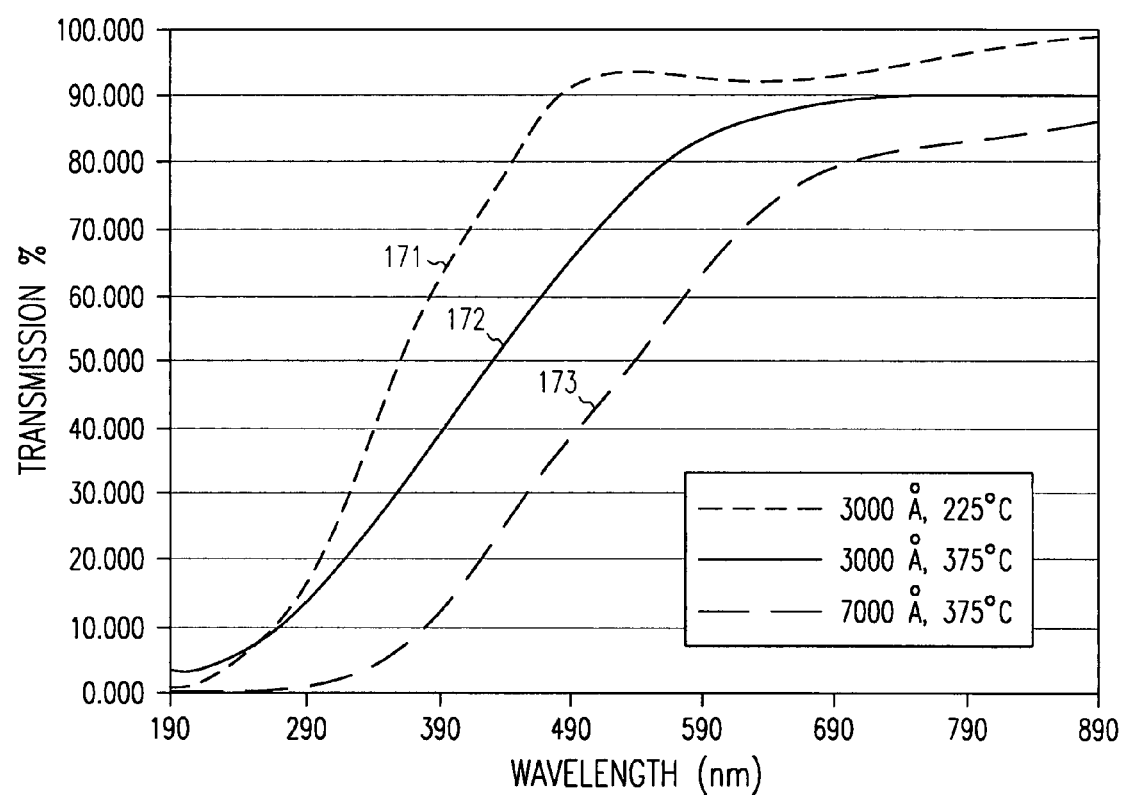
FIG. 1D is graph showing a transmission percentage versus a range of wavelengths of several transparent amorphous carbon layers at exemplary temperatures and exemplary thicknesses according to an embodiment of the invention.

FIG. 1D is graph showing transmission percentage versus a range of wavelengths of several transparent amorphous carbon layers at exemplary temperatures and exemplary thicknesses according to an embodiment of the invention. In some embodiments, the graph of FIG. 1D shows exemplary transmission percentages of the transparent amorphous carbon layer formed according to the method described in FIG. 1A.

In FIG. 1D, curves 171, 172, and 173 show transmission percentage versus a range of wavelengths for three different amorphous carbon layers formed to different thicknesses at different temperatures. Curve 171 shows transmission percentage versus a range of wavelengths of a transparent amorphous carbon layer formed to a thickness of 3000 Angstroms at a temperature of 225° C. Curve 172 shows transmission percentage versus the range of wavelengths of a transparent amorphous carbon layer formed to a thickness of 3000 Angstroms at a temperature of 375° C. Curve 173 shows transmission percentage versus the range of wavelengths of a transparent amorphous carbon layer formed to a thickness of 7000 Angstroms at a temperature of 375° C. FIG. 1D shows that the transmission increases when the thicknesses, or the temperature, or both decreases.

Figure 1E:
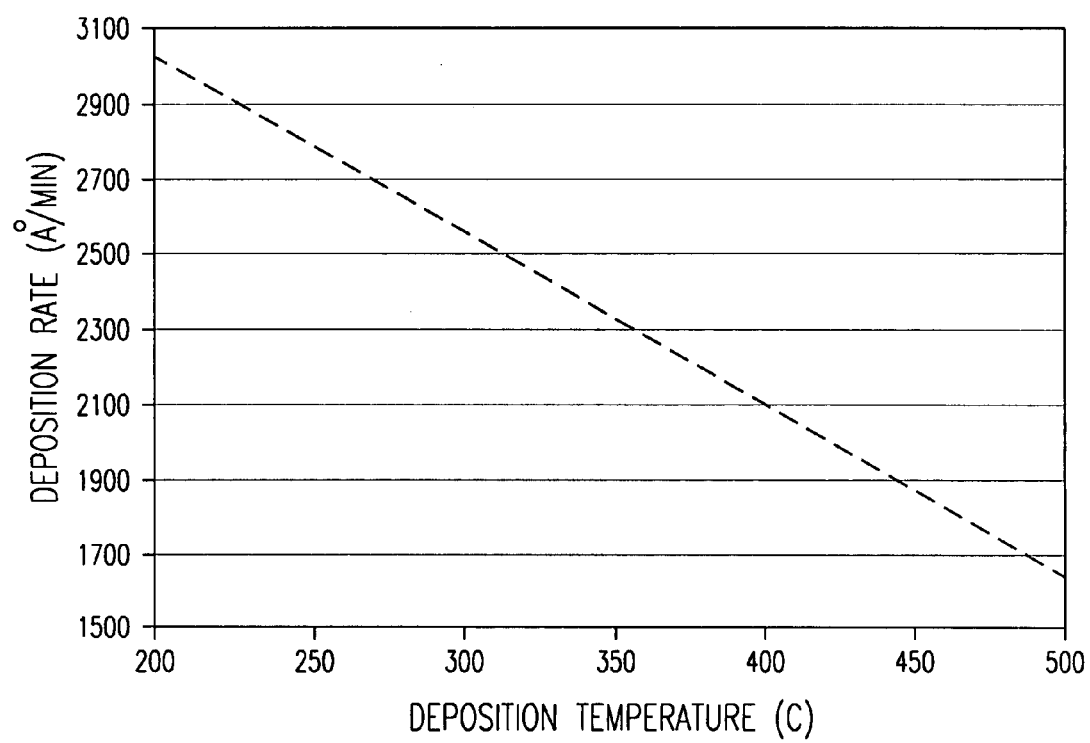
FIG. 1E is graph showing an exemplary deposition rate versus a temperature range of a method of forming a transparent amorphous carbon layer according to an embodiment of the invention.

FIG. 1E is graph showing exemplary deposition rate versus a temperature range of a method of forming a transparent amorphous carbon layer according to an embodiment of the invention. In some embodiments, the graph of FIG. 1E shows exemplary deposition rate of the transparent amorphous carbon layer formed according to the method described in FIG. 1A. FIG. 1E shows that the deposition rate is inversely proportional to the temperature. For example, at a temperature of 250° C., the deposition rate is about 2800 Angstroms per minute. As another example, at a temperature of 400° C., the deposition rate is about 2100 Angstroms per minute.

FIG. 2 through FIG. 10 show a device 200 during various processing stages according to embodiments of the invention.

Figure 2:
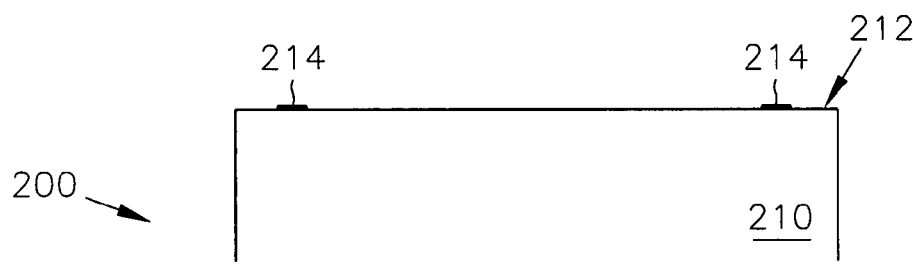

FIG. 2 shows a cross-section of a device 200 including a substrate 210. Substrate 210 may represent a part of a wafer, or may be a wafer itself. The wafer may be a semiconductor wafer such as a silicon wafer. Substrate 210 may also be a structure or a layer formed on a wafer. Substrate 210 may include at least one of a non-conducting material, a conducting material, and a semiconducting material. Examples of non-conducting materials include oxide (e.g., $SiO_2$, $Al_2O_3$), nitride (e.g., $Si_3N_4$), and glass (borophosphosilicate glass-BPSG). Examples of conducting materials include aluminum, tungsten, other metals, and compound of metals. Examples of semiconducting materials include silicon, and silicon doped with other materials such as boron, phosphorous, and arsenic. In embodiments represented by FIG. 2, substrate 210 includes a semiconductor material.

Substrate 210 has a surface 212 in which alignment marks 214 are formed. Alignment marks 214 serves as reference points or coordinates of substrate (wafer) 210. During an alignment process, the alignment marks 214 are used to align or position substrate 210 such that structures and layers on substrate 210 can be accurately aligned with each other or with substrate 210.

Figure 3:
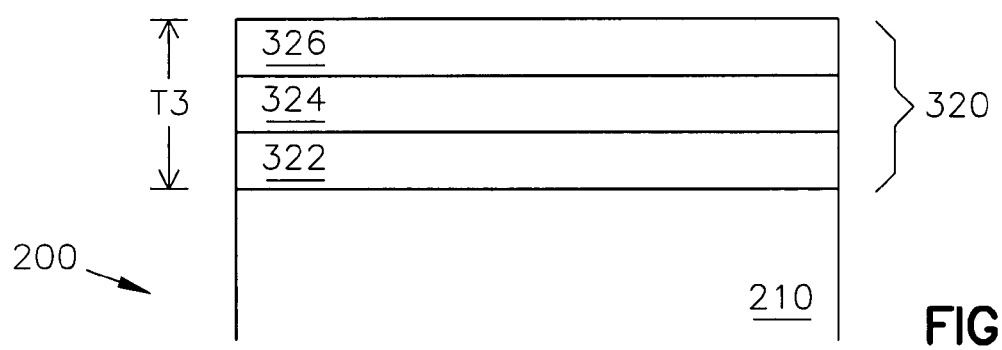

FIG. 3 shows device 200 with a device structure 320 formed over substrate 210. Device structure 320 includes multiple layers 322, 324, and 326. Each of these multiple layers may include at least one of a non-conducting material, semiconducting material, and a conducting material. For example, layer 322 may be an oxide layer; layer 324 may be a metal layer or a layer having a compound of metal and silicon; and layer 326 may be a nitride layer. In some embodiments, multiple layers 322, 324, and 326 are arranged in an order different from the order shown in FIG. 3. Multiple layers 322, 324, and 326 are formed by growing or deposition or by other known processes. In some embodiments, one or more of the layers 322, 324, and 326 is omitted from device structure 320. In other embodiments, one or more additional layers similar to layers 322, 324, and 326 are added to device structure 320. Device structure 320 has a thickness T3. In some embodiments, T3 is at least 40000 Angstroms.

Figure 4A:
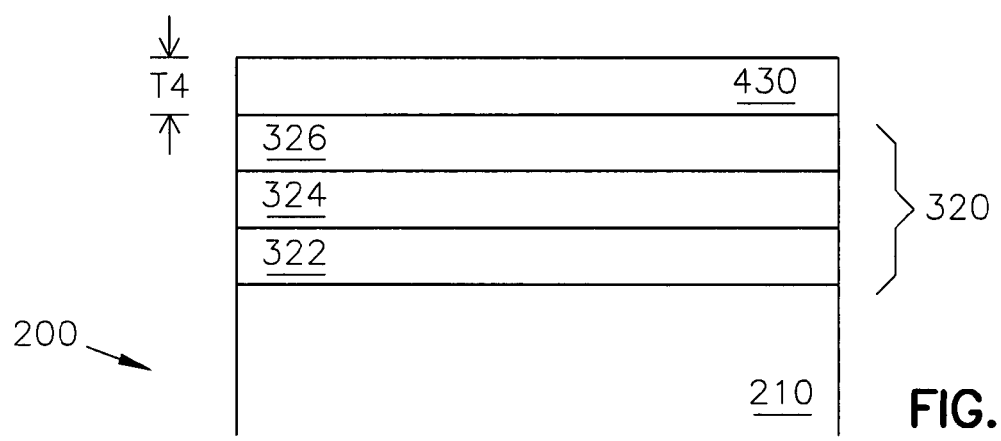

FIG. 4A shows device 200 with a mask (layer) 430 formed over device structure 320. Mask 430 is made of carbon. In embodiments represented by FIG. 4A, the carbon is amorphous carbon. Thus, in FIG. 4A, mask 430 is also referred to as amorphous carbon layer 430. Amorphous carbon layer 430 may be formed by a method similar to method 100 described in FIG. 1A.

Amorphous carbon layer 430 has a thickness T4. T4 can be any thickness. In an embodiment, T4 has a thickness of about 1500 Angstroms. In another embodiment, T4 has a thickness of about 2000 Angstroms. In some embodiments, T4 is at least 4000 Angstroms. In various embodiments, T4 has a thickness that ranges from about 1000 Angstroms to about 12000 Angstroms. Amorphous carbon layer 430 has a low absorption coefficient such that amorphous carbon layer 430 is transparent in visible light range. In some embodiments, amorphous carbon layer 430 has an extinction coefficient (k) between about 0.15 and about 0.001 at wavelength of 633 nm.

Since amorphous carbon layer 430 is transparent in visible light range, amorphous carbon layer 430 does not substantially absorb or reflect the light in the visible light range. Therefore, the transparency in visible light range property of amorphous carbon layer 430 improves the reading of alignment marks 214 (FIG. 2) on substrate 210 during the alignment of substrate 210. Further, since amorphous carbon layer 430 is transparent in visible light range, the thickness of amorphous carbon layer 430 may not be limited. Thus, amorphous carbon layer 430 may be formed with a thickness to properly etch device structure 320 while allowing an accurate reading of the alignment marks such as alignment marks 214.

In comparing amorphous carbon layer 430 with a conventional amorphous carbon layer having a higher absorption coefficient (or less transparent) than that of amorphous carbon layer 430, the conventional amorphous carbon may have a thickness limitation for some processes. For example, some process may require a mask with a specific thickness, using a conventional amorphous carbon layer with the specific thickness may cause difficulty in reading the alignment marks or may result in inaccurate reading because of the high absorption property of the conventional amorphous carbon layer. Therefore, because of the low absorption property, amorphous carbon layer 430 is useful in processes that may require a mask with a specific thickness in which a conventional amorphous carbon mask is unsuitable.

Amorphous carbon layer 430 of device 200 is formed with a thickness sufficient to properly etch a device structure such as device structure 320. For example, amorphous carbon layer 430 is formed with thickness T4 equal to or greater than about 4000 Angstroms to etch device structure 320 with thickness T3 equal to or greater than 40000 Angstroms.

Figure 4B:
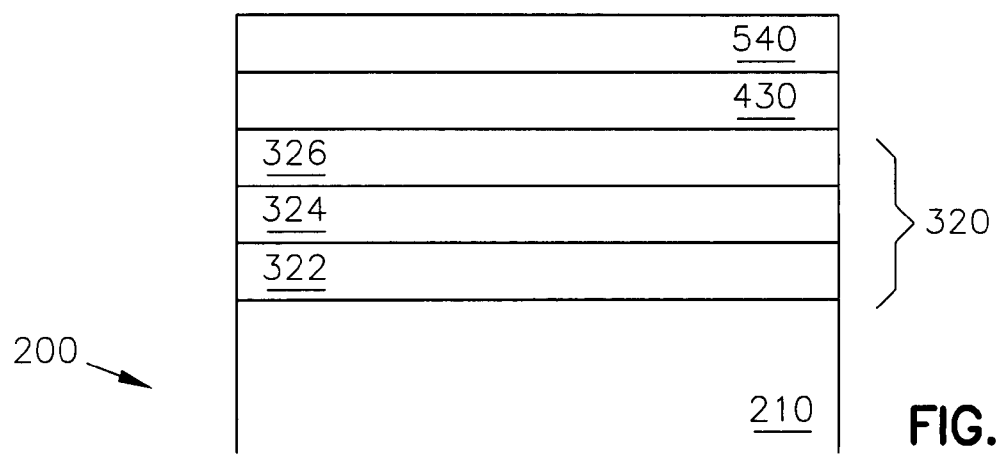

FIG. 4B shows device 200 with a cap layer 540 formed over amorphous carbon layer 430. In some embodiments, cap layer 540 includes oxide materials. In other embodiments, cap layer 540 includes non-oxide materials. In FIG. 4B, cap layer 540 includes silicon oxynitride ($Si_xO_yN_z$) or silicon-rich oxide ($Si_xO_y$) where x, y, and z are real numbers. In some embodiments, cap layer 540 includes hydrogenated silicon oxynitride ($Si_xO_yN_z$:H) or hydrogenated silicon-rich oxide ($Si_xO_y$:H).

Cap layer 540 can be formed by a deposition process such as a CVD and PECVD process. In some embodiments, cap layer 540 is formed together with amorphous carbon layer 430 in the same process (same processing step) such that cap layer 540 is in situ deposited over amorphous carbon layer 430.

FIG. 5 shows device 200 with a photoresist layer 550 formed over cap layer 540 and amorphous carbon layer 430. Photoresist 550 is formed using known techniques. In some embodiments, cap layer 540 serves as an antireflective layer for reducing the reflection to photoresist layer 550 from layers underneath amorphous carbon layer 430 during patterning of photoresist layer 550. Reducing the reflection allows more accurate patterning of photoresist layer 550. In other embodiments, cap layer 540 serves as a mask for patterning amorphous carbon layer 430. In some other embodiments, cap layer 540 serves as both an antireflective layer and as a mask.

The combination of amorphous carbon layer 430, cap layer 540, and photoresist layer 550 forms a masking structure 560. In some embodiments, cap layer 540 is omitted from masking structure 560. In other embodiments, besides amorphous carbon layer 430, cap layer 540, and photoresist layer 550, masking structure 560 further includes an additional layer formed between photoresist layer 550 and cap layer 540. The additional layer serves as an antireflective layer to further enhance the photo processing performance.

FIG. 6 shows device 200 after photoresist layer 550 is patterned. Patterning photoresist layer 550 can be performed using known techniques. In FIG. 6, patterned photoresist layer 550 has openings 652. Patterned photoresist layer 550 is used as a mask to pattern cap layer 540 and amorphous carbon layer 430.

FIG. 7 shows device 200 after the masking structure 560 is patterned. Patterning masking structure 560 can be performed by one or more etching steps. In some embodiments, cap layer 540 and amorphous carbon layer 430 are etched together in one etching step. In other embodiments, cap layer 540 and amorphous carbon layer 430 are etched separately in different etching steps. As shown in FIG. 7, each of the patterned cap layer 540 and the patterned amorphous carbon layer 430 has openings that are continuous and aligned with openings 652 of photoresist layer 550. In some embodiments, after amorphous carbon layer 430 is patterned, the combination of layers 430, 540, and 550 of masking structure 560 may remain and is used as a mask to etch the layers of device structure 320. In other embodiments, after amorphous carbon layer 430 is patterned, either photoresist layer 550 or a combination of both photoresist layer 550 and cap layer 540 is removed. The remaining (not removed) layer, or layers, of masking structure 560 is used as a mask to etch one or both of device structure 320 and substrate 210.

Figure 8:
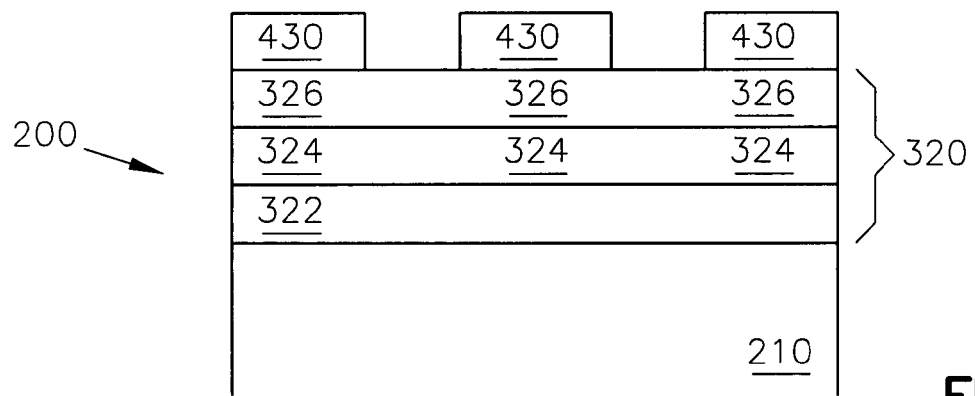

FIG. 8 shows device 200 after both photoresist layer 550 and cap layer 540 are removed. In this example, the remaining amorphous carbon layer 430 is used as a mask to etch either a portion of device structure 320, or the entire device structure 320. In some embodiments, at least a portion of substrate 210 is also etched using amorphous carbon layer 430 as a mask.

Figure 9:
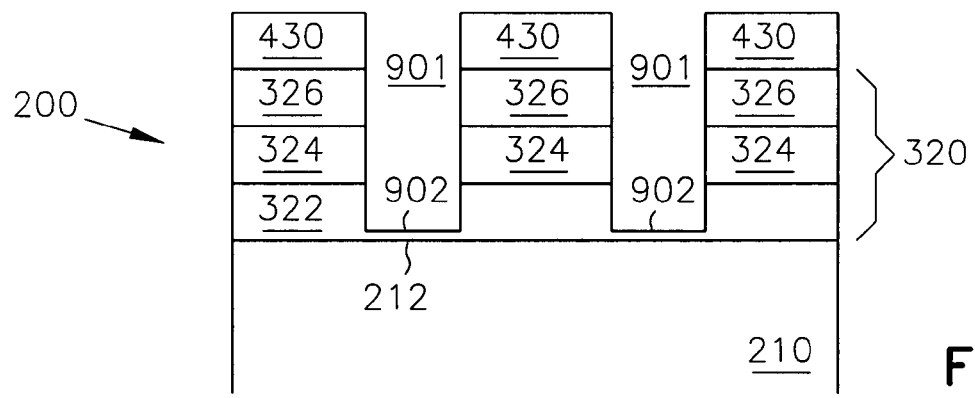

FIG. 9 shows device 200 after device structure 320 is etched. Trenches 901 are formed as a result of the etching process. In embodiments represented by FIG. 9, trenches 901 are formed in at least portion of device structure 320. In some embodiments, trenches 901 are formed in the entire device structure 320 and in at least a portion of substrate 210.

Layer 322 is etched to a level 902. Level 902 is any level above surface 212 of substrate 210. In embodiments represented by FIG. 9, device structure 320 is etched such that the etching process penetrates through layers 326 and 324 and partially into layer 324 and stopping at level 902. In some embodiments, device structure 320 is etched such that level 902 can be anywhere in device structure 320. In other embodiments, the etching process penetrates through all layers 322, 324, and 326 and stops at or below surface 212 of substrate 210. The level at which the etching process etches into device structure 320 depends on what will be formed after device structure 320 is etched. For example, device structure 320 is etched to one level if conductive interconnects will be formed and device structure 320 is etched to another level if a component such as a capacitor will be formed.

Figure 10:
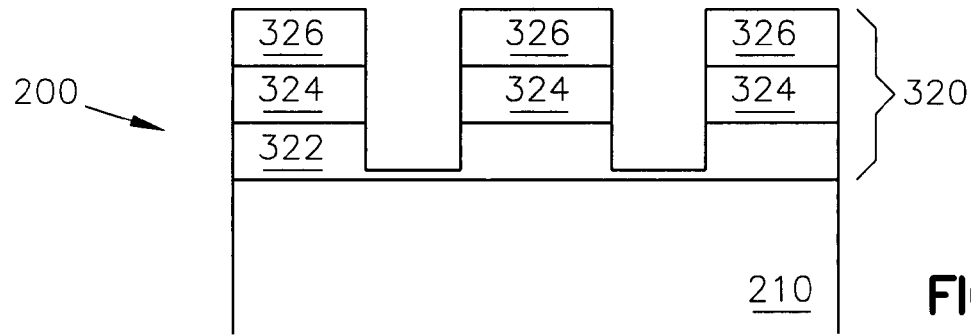

FIG. 10 shows device 100 after amorphous carbon layer 430 is removed. In some embodiments, amorphous carbon layer 430 is removed using an ash process with oxygen plasma. In other embodiments, amorphous carbon layer 430 is removed using an ash process with a combination of oxygen plasma and $CF_4$.

In the above description of FIG. 4A through FIG. 10, amorphous carbon layer 430, which is transparent in visible light range, is included in masking structure 560 to use as a mask to etch device structure 320. In some embodiments, an amorphous carbon layer such as amorphous carbon layer 430 is also included in device structure 320. For example, one of the layers 322, 324, and 326 of device structure 320 may be an amorphous carbon layer such as amorphous carbon layer 430. As another example, device structure 320 may include an additional layer besides layer 322, 324, and 326 in which the additional layer is an amorphous carbon layer such as amorphous carbon layer 430.

In embodiments where an amorphous carbon layer exists within device structure 320, the amorphous carbon layer within device structure 320 may be used for insulating purposes, antireflection purposes, or for other purposes. Hence, in embodiments where device structure 320 includes an amorphous carbon layer similar to amorphous carbon layer 430, the amorphous carbon layer of device structure 320 still remains in device 200 after amorphous carbon layer 430 of masking structure 560 is removed from device 200.

After amorphous carbon layer 430 is removed as shown in FIG. 10, other processes can be performed to device 200 to form components such as transistors, capacitors, memory cell, or an integrated circuit such as a memory device, a processor, an application specific integrated circuit, or other types of integrated circuits.

Figure 11:
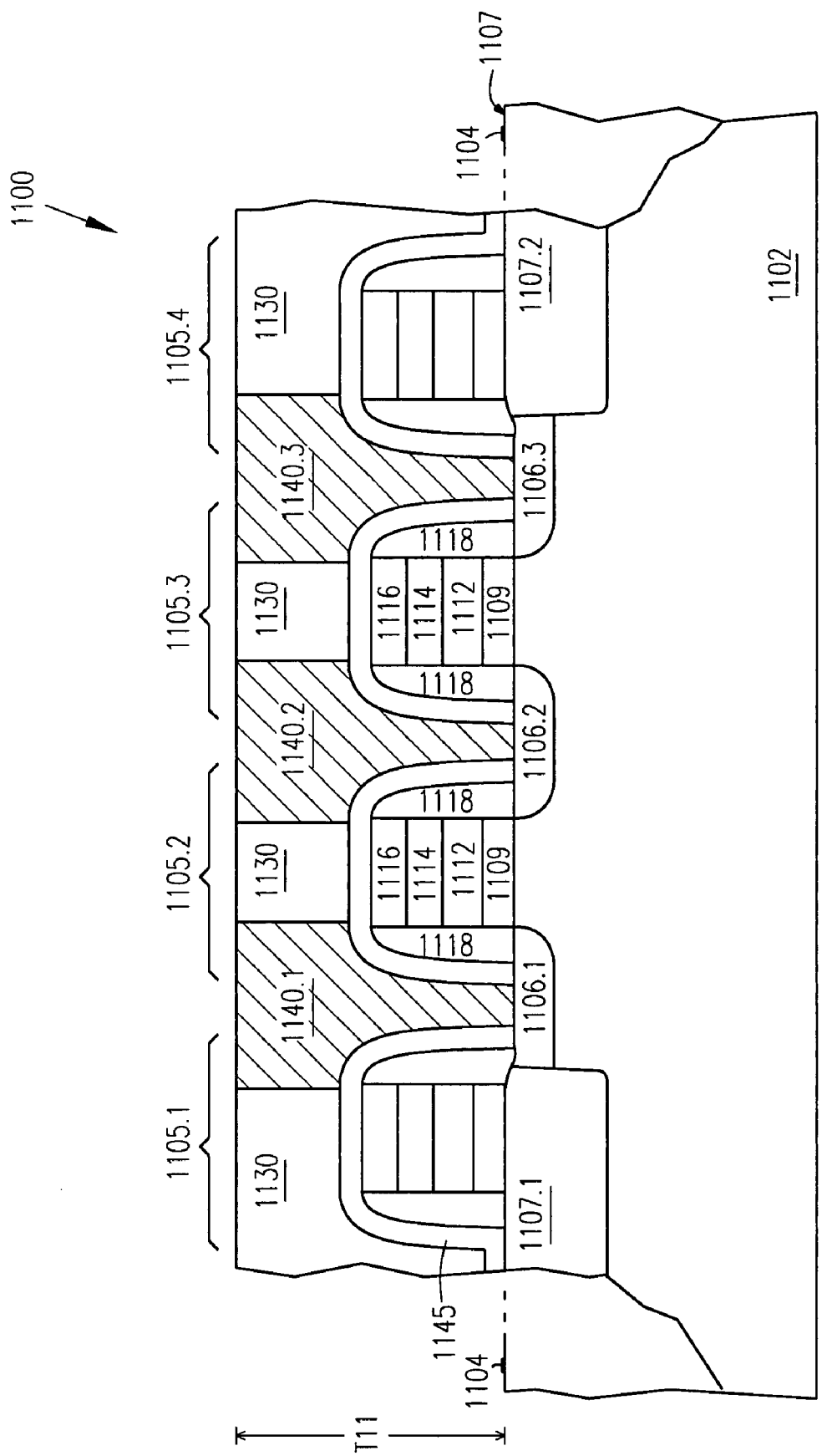
FIG. 11 through FIG. 19 show cross-sections of a memory device during various processing stages according to embodiments of the invention.

FIG. 11 through FIG. 19 show cross-sections of a memory device 1100 during various processing stages according to embodiments of the invention. In FIG. 11, memory device 1100 includes a substrate 1102 having alignment marks 1104 formed on surface 1107 of substrate 1102. A number of surface structures (gate structures) 1105 (1105.1 through 1105.4) are formed over substrate 1102. Within substrate 1102, a number of diffusion regions 1106 (1106.1 through 1106.3) and isolation structures 1107.1 and 1107.2 are formed. For clarity, FIG. 11 shows alignment marks 1104 without elements formed above alignment marks 1104. However, elements such as the layers shown in FIG. 11 may be formed over alignment marks 1104.

Memory device 1100 also includes an insulating layer 1130 and a number of contacts 1140 (1140.1 through 1140.3) extending through insulating layer 1130. Each of the contacts 1140 connects to one of the diffusion regions 1106. A barrier layer 1145 separates surface structures 1105 from insulating layer 1130 and contacts 1140. Contacts 1140 are made of conducting material to provide electrical connections for diffusion regions 1106. Barrier layer 1145 can be oxide, or nitride, or other non-conducting materials to prevent cross-diffusion of materials between surface structures 1105 and insulating layer 1130. In some embodiments, barrier layer 1145 is omitted. Insulating layer 1130 provides insulation between the contacts 1140. Insulating layer 1130 can be a layer of silicate glass doped with one or more dopants such as boron and phosphorous or other types of doped glasses. For example, insulating layer 1130 can be Boronsilicate glass (BSG), or Phosphosilicate glass (PSG). In embodiments represented by FIG. 11, insulating layer 1130 includes Borophosphosilicate glass (BPSG) and has a thickness T11. In some embodiments, T11 is in the range of 3000 Angstroms to 5000 Angstroms.

In embodiments represented by FIG. 11, substrate 1102 includes silicon doped with a dopant, for example boron, to make it a P-type material. Diffusion regions 1106 are doped with a dopant, for example phosphorous, to make them an N-type material. In some embodiments, substrate 1102 can be an N-type material and diffusion regions 1106 can be a P-type material.

Each of the gate structures 1105 includes a number of elements: a gate dielectric (gate oxide) 1109, a doped polysilicon layer 1112, a silicide layer 1114, a capping dielectric layer 1116, and dielectric spacers 1118. Silicide layer 1114 can include a compound of metal and silicon such as titanium silicide, tungsten silicide, and others. All dielectrics in gate structures 1105 can include material such as silicon oxide. Each of the gate structures 1105 is also referred to as a word line. The structure of FIG. 11 can be formed using known techniques.

Figure 12:
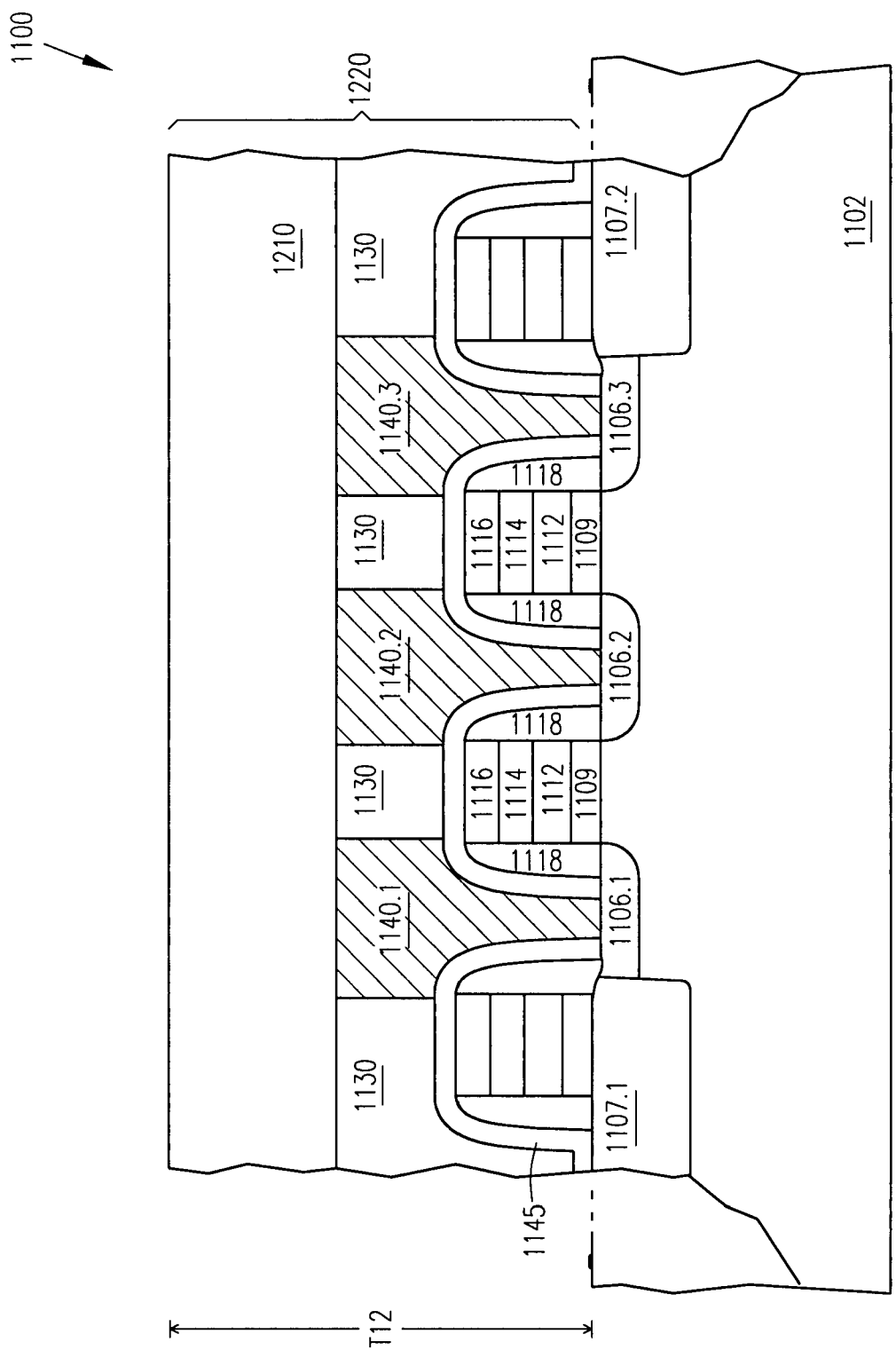

FIG. 12 shows memory device 1100 after an insulating layer 1210 is formed. Insulating layer 1210 can include BSG, PSG, or BPSG similar to insulating layer 1130. Insulating layer 1210 and other structures in FIG. 12 form a device structure 1220. Device structure 1220 has a thickness T12. In some embodiments, T12 is at least 40000 Angstroms.

Figure 13:
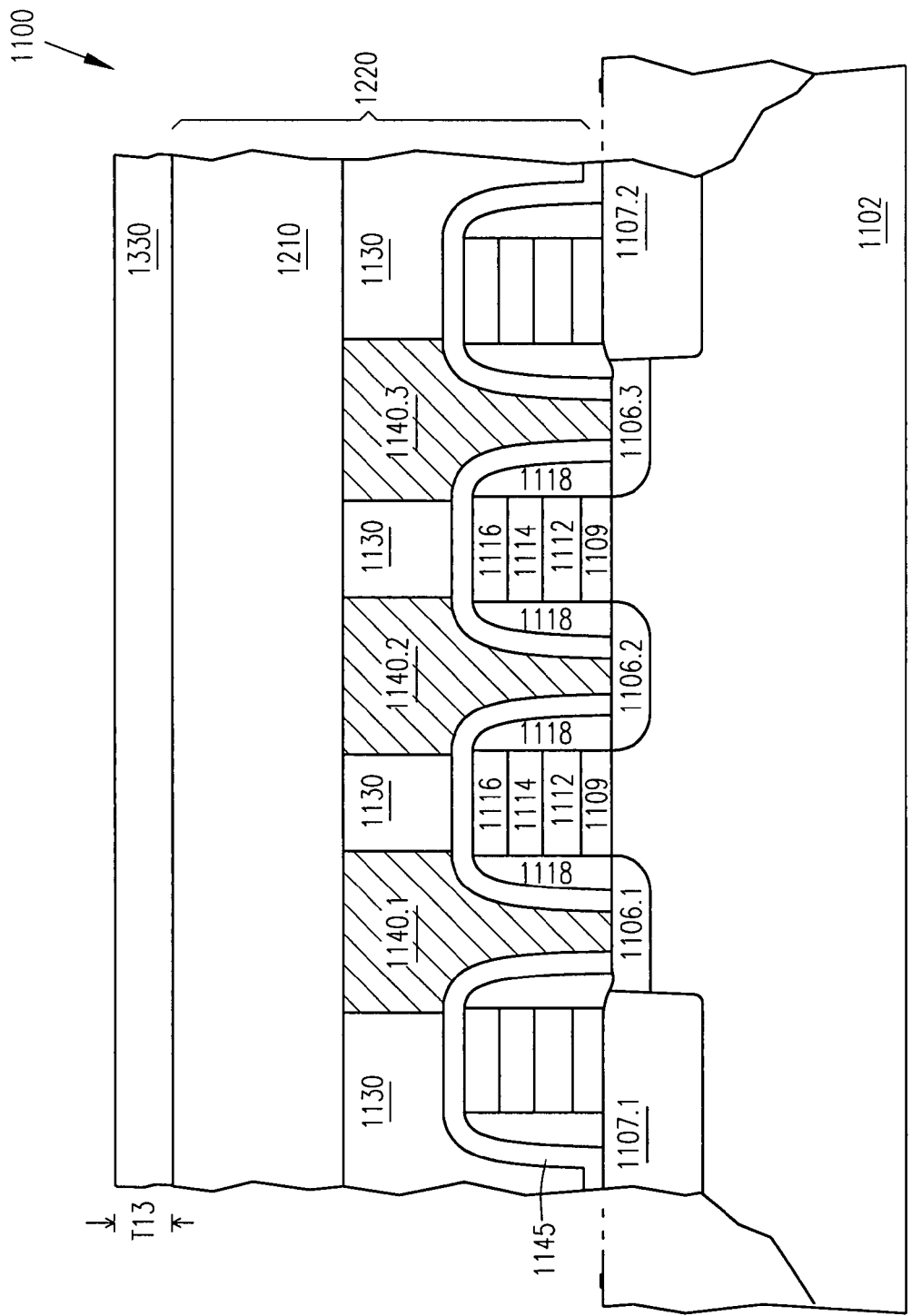

FIG. 13 shows memory device 1100 after an amorphous carbon layer 1330 is formed over device structure 1220. Amorphous carbon layer 1330 has a low absorption coefficient such that amorphous carbon layer 1330 is transparent in visible light range. In some embodiments, amorphous carbon layer 1330 has an extinction coefficient (k) between about 0.15 and about 0.001 at wavelength of 633 nm. Amorphous carbon layer 1330 may be formed by a method similar to method 100 described in FIG. 1A.

Since amorphous carbon layer 430 is transparent in visible light range, amorphous carbon layer 1330 may be formed at a selected thickness to properly etch device structure 1220 without substantially affecting the reading of the alignment marks 1104 during an alignment of device 1100. Amorphous carbon layer 1330 has a thickness T13, which can be selected at an appropriate value to properly etch device structure 1220. T13 can be any thickness. In some embodiments, T13 is at least 4000 Angstroms.

Figure 14:
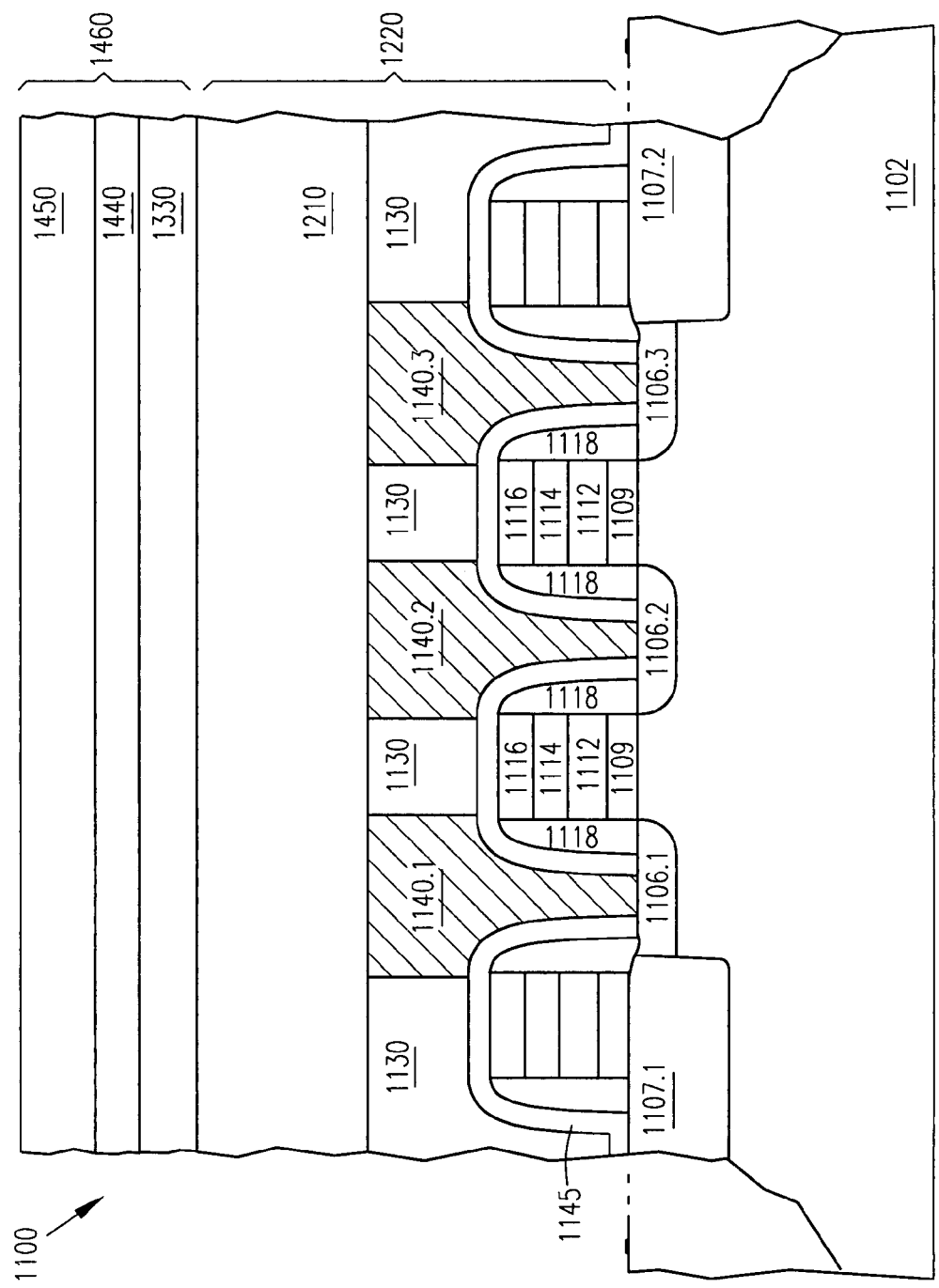

FIG. 14 shows memory device 1100 after a cap layer 1440 and a photoresist layer 1450 are formed over amorphous carbon layer 1330. In some embodiments, cap layer 1440 includes oxide materials. In other embodiments, cap layer 1440 includes non-oxide materials. In FIG. 14, cap layer 1440 includes silicon oxynitride ($Si_xO_yN_z$) or silicon-rich oxide ($Si_xO_y$) where x, y, and z are real numbers. In some embodiments, cap layer 1440 includes hydrogenated silicon oxynitride ($Si_xO_yN_z$:H) or hydrogenated silicon-rich oxide ($Si_xO_y$:H). Layers 1440 and 1450 are formed using known techniques. Amorphous carbon layer 1330, cap layer 1440, and photoresist layer 1450 form a masking structure 1460. In some embodiments, cap layer 1440 is omitted from masking structure 1460. In other embodiments, masking structure 1460 further includes an additional layer formed between photoresist layer 1450 and cap layer 1440. The additional layer serves as an antireflective layer to further enhance the photo processing performance.

Figure 15:
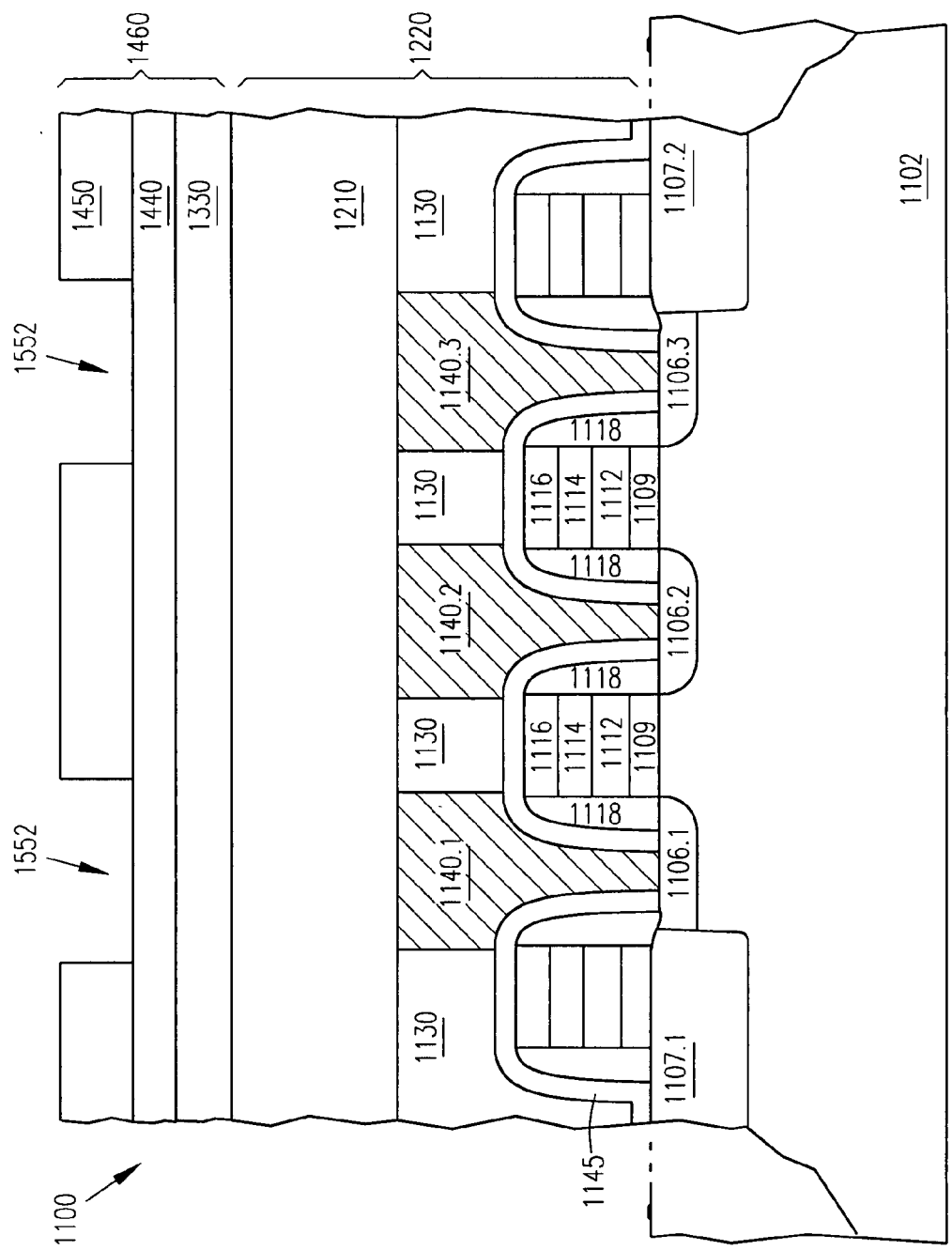

FIG. 15 shows device 1100 after photoresist layer 1450 is patterned. Patterning photoresist layer 1450 can be performed using known techniques. Patterned photoresist layer 1450 includes openings 1552.

Figure 16:
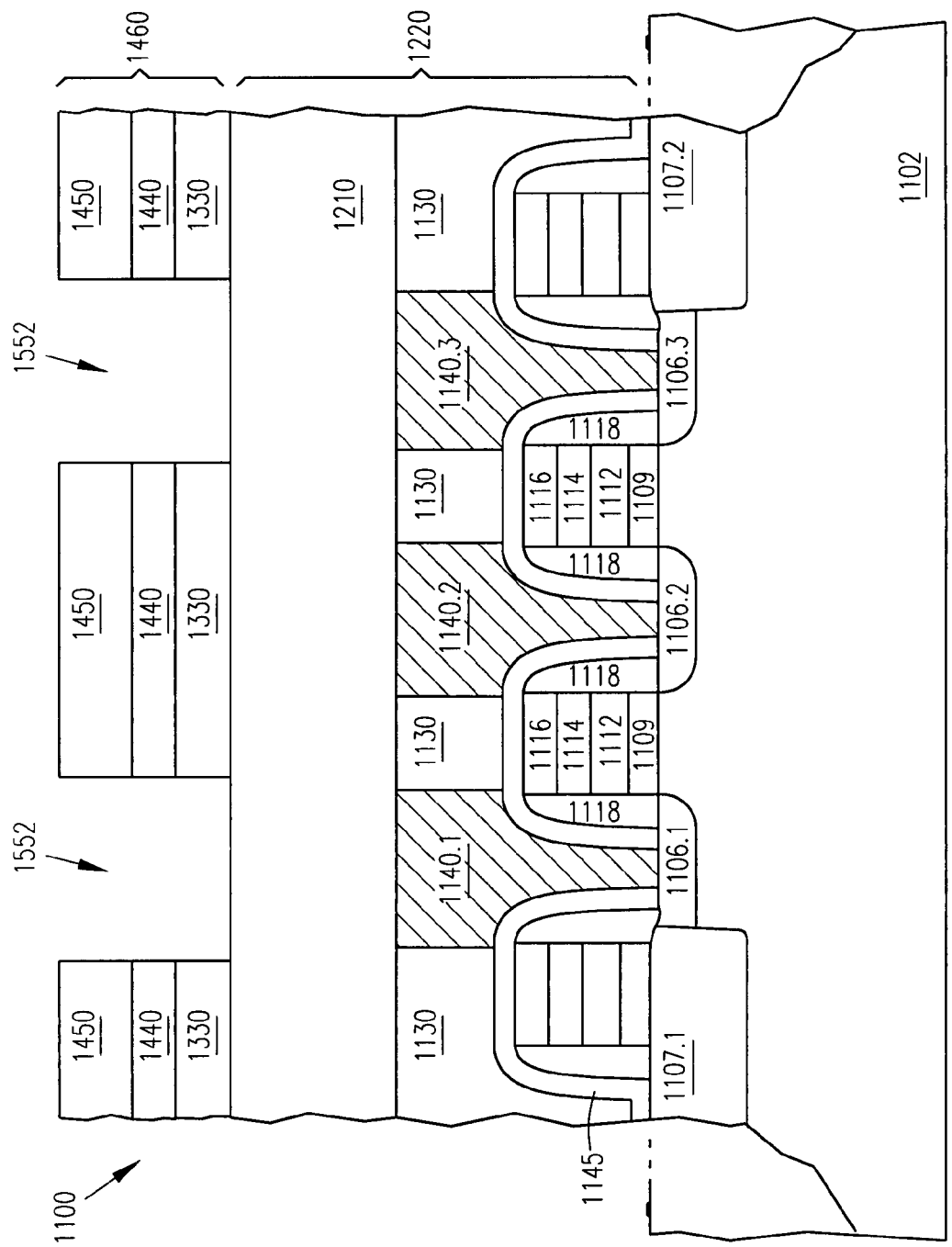

FIG. 16 shows device 1100 after masking structure 1460 is patterned. Patterning masking structure 1460 can be performed by one or more etching steps. In some embodiments, cap layer 1440 and amorphous carbon layer 1330 are etched together in one etching step. In other embodiments, cap layer 1440 and amorphous carbon layer 1330 are etched separately in different etching steps. As shown in FIG. 16, after patterning, each of the patterned cap layer 1440 and the patterned amorphous carbon layer 1330 includes openings that are continuous and aligned with openings 1552 of photoresist layer 1450.

In some embodiments, after amorphous carbon layer 1330 is patterned, the combination of layers 1330, 1440, and 1450 of masking structure 1460 may remain and is used as a mask to etch the layers of device structure 1220. In other embodiments, after amorphous carbon layer 1330 is patterned, either photoresist layer 1450 or a combination of both photoresist layer 1450 and cap layer 1440 is removed. The remaining (not removed) layer, or layers, of masking structure 1220 is used as a mask to etch device structure 1220.

Figure 17:
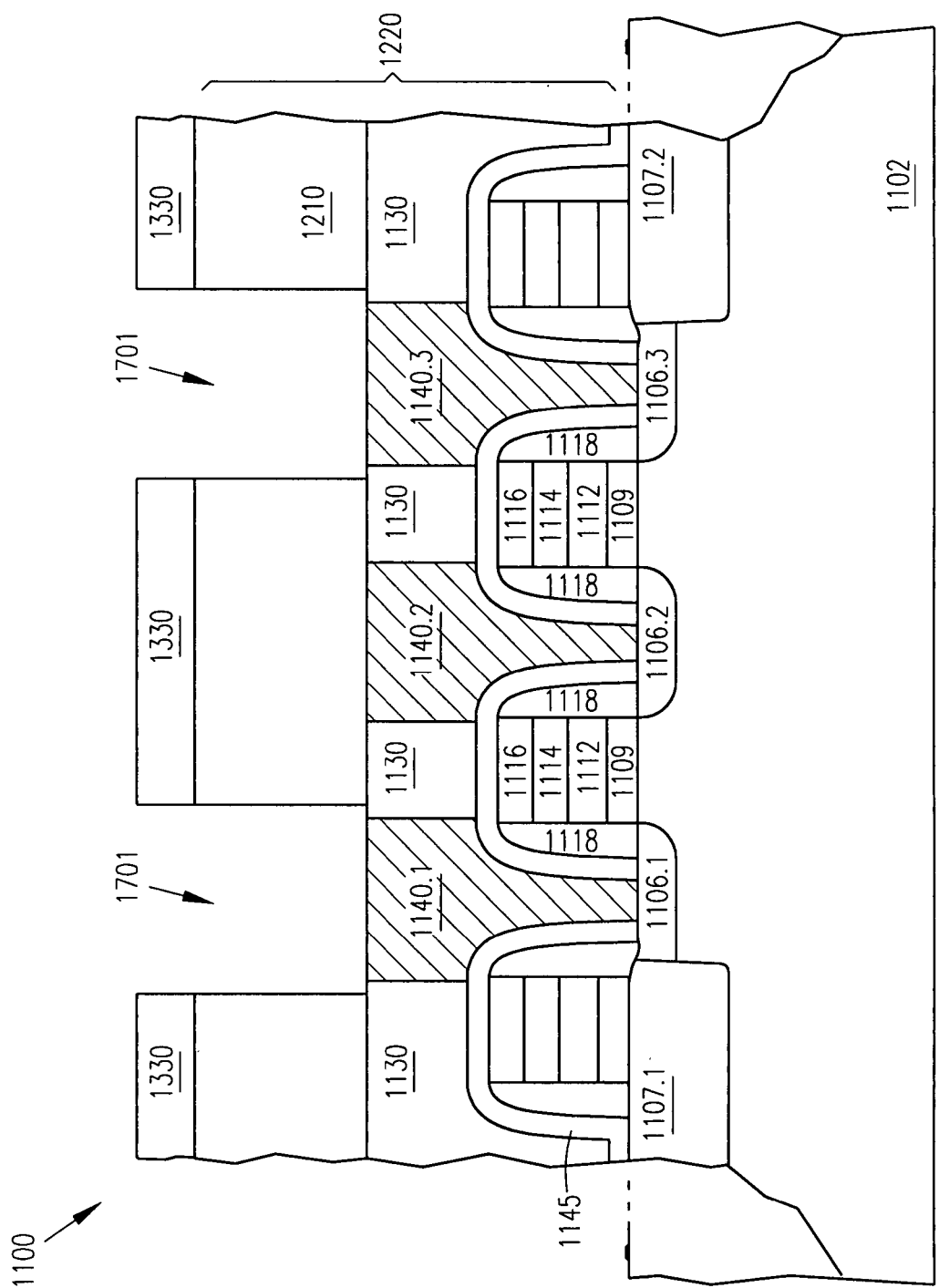

FIG. 17 shows device 1100 after device structure 1220 is etched. In embodiments represented by FIG. 16, both photoresist layer 1450 and cap layer 1440 are removed before device structure 1220 is etched. Amorphous carbon layer 1330 is used as a mask to etch the layers of device structure 1220. The etched device structure 1220 has openings 1701.

Figure 18:
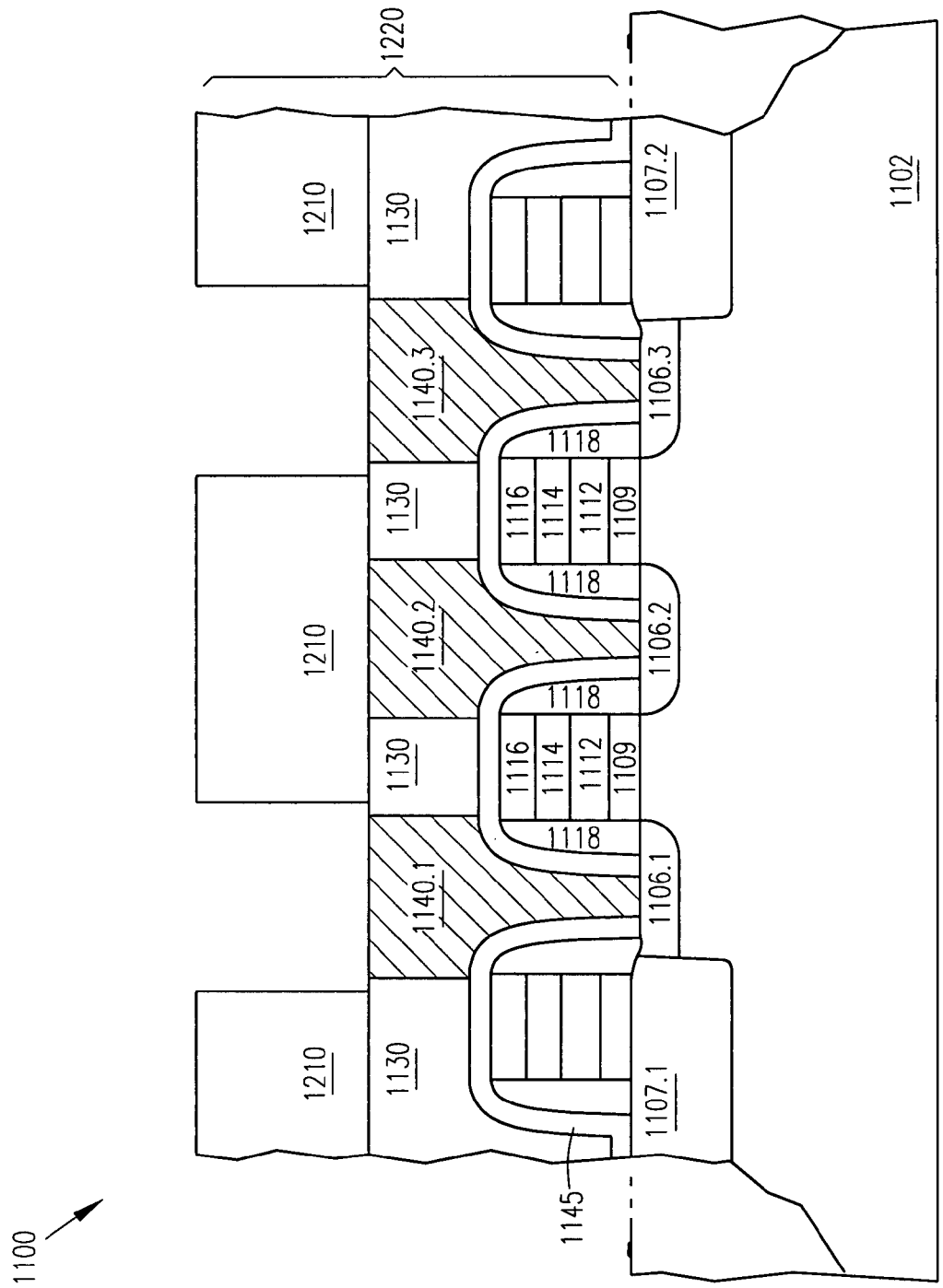

FIG. 18 shows device 1100 after amorphous carbon layer 1330 is removed. In some embodiments, amorphous carbon layer 1330 is removed using an ash process with oxygen plasma. In other embodiments, amorphous carbon layer 1330 is removed using an ash process with a combination of oxygen plasma and $CF_4$.

Figure 19:
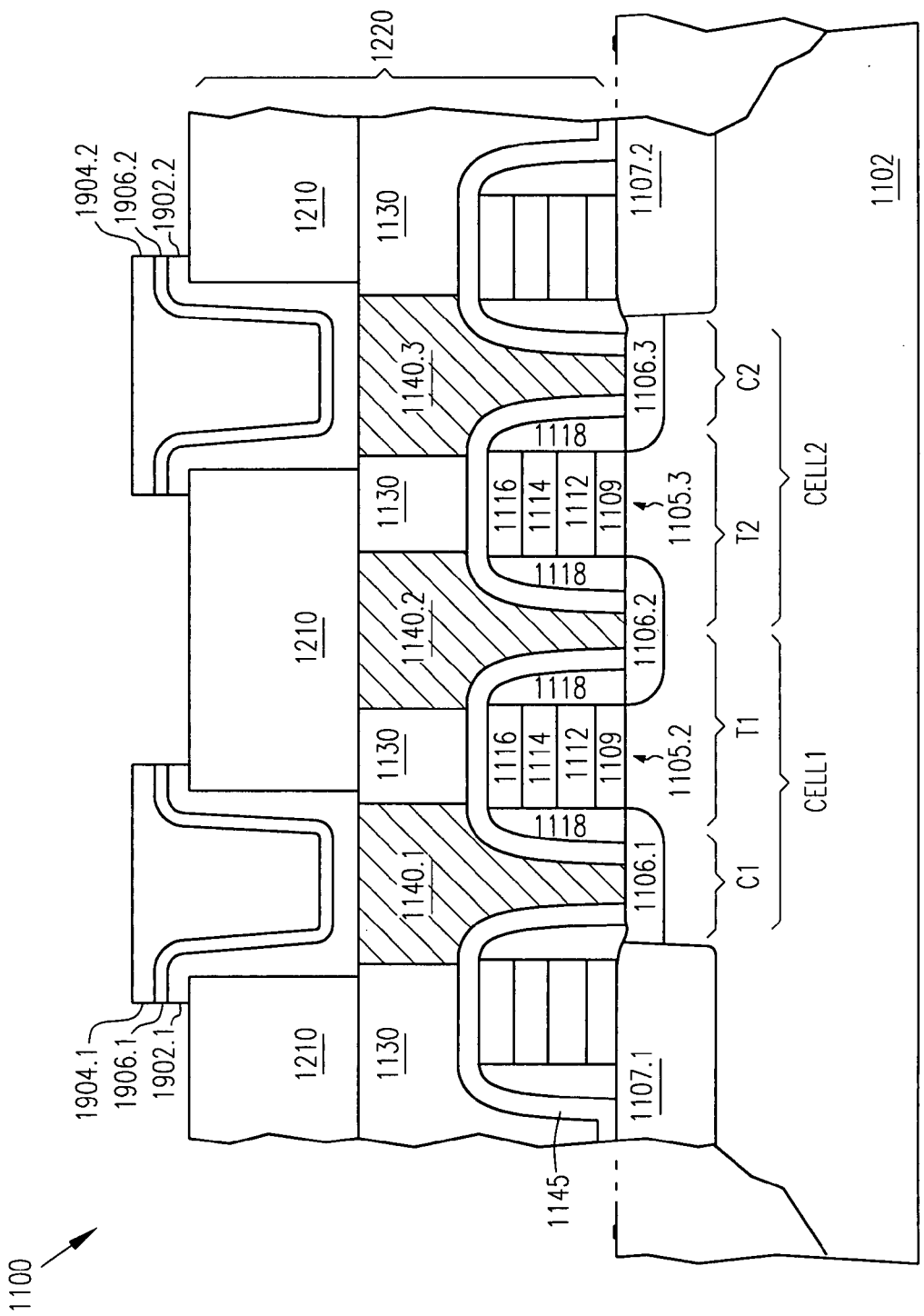

FIG. 19 shows device 1100 after other layers are formed using known techniques. In each of the openings 1552, a first conductive layer 1902 (1902.1 and 1902.2), a second conductive layer 1904 (1904.1 and 1904.2), and a dielectric layer 1906 (1906.1 and 1906.2) are formed. Conductive layers 1902, 1904, dielectric layer 1906 and other elements form storage capacitors C1 and C2. For example, in storage capacitor C1, conductive layer 1902.1, contact 1140.1, and diffusion region 1106.1 form a first capacitor plate (bottom plate); conductive layer 1902.2 forms a second capacitor plate (top plate); and dielectric layer 1906.1 is the capacitor dielectric. In some embodiments, conductive layers 1904 connect to a common cell plate of memory device 1100. The common cell plate is omitted from FIG. 19 for simplicity.

Memory device 1110 includes access transistors T1 and T2. Gate structure 1105.2 and diffusion regions 1106.1-1106.2 form access transistor T1. Gate structure 1105.3 and diffusion regions 1106.2-1106.3 form access transistor T2. Access transistor T1 and storage capacitor C1 form a memory CELL1. Access transistor T2 and storage capacitor C2 form a memory CELL2.

Memory cells CELL1 and CELL2 store data in form of charge in storage capacitors C1 and C2. The charges are transferred to and from doped regions 1106.1 and 1106.3 of capacitors C1 and C2 via contact 1140.2. In some embodiments, contact 1140.2 is a buried bit line contact, which connects to a bit line of memory device 1100.

In other embodiments, other elements having structures different from the structures of the layers 1902, 1904, and 1906 can be formed in openings 1701 (FIG. 17). For example, interconnects instead of capacitor plates can be formed in openings 1552 to connect diffusion regions 1106 to other parts of memory device 1100.

Memory device 1100 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAMs. Memory device 1100 includes other elements, which are not shown for clarity.

Figure 20:
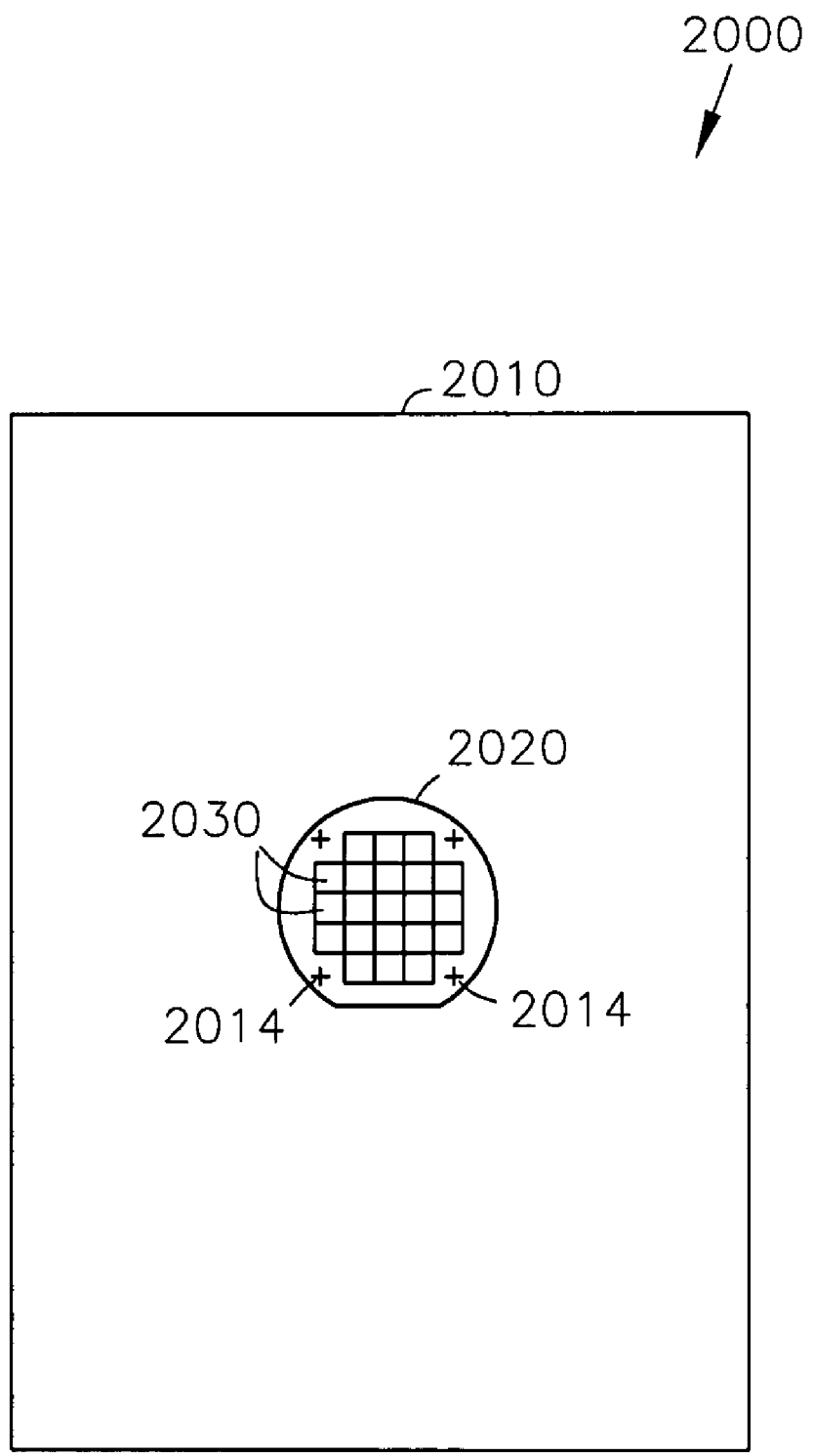
FIG. 20 shows a system according to an embodiment of the invention.

FIG. 20 shows a system according to an embodiment of the invention. System 2000 includes a chamber 2010 and a wafer 2020 placed in the chamber. In some embodiments, chamber 2010 is a PECVD chamber and wafer 2020 is a semiconductor wafer. An example of chamber 2010 includes a chamber of the Producer Processor available from Applied Materials, Inc. located in Santa Clara, Calif. Chamber 2010 and wafer 2020 can be used in method 100 described in FIG. 1A to form the transparent amorphous carbon layer according to method 100.

Wafer 2020 includes a number of alignment marks 2014 and a number of dice 2030. In some embodiments, alignment marks 2014 represent alignment marks 214 (FIG. 2) and alignment marks 1104 (FIG. 11).

At least one of the dice 2030 includes elements according to embodiments described in FIG. 2-FIG. 19 above. For example, at least one of the dice 2030 includes a substrate, a device structure, and a masking structure such as those of devices 200 and 1100 (FIG. 2-FIG. 19). Thus, at least one of the dice 2030 includes an amorphous carbon layer such as amorphous carbon layer 430 (FIG. 4A) and amorphous carbon layer 1330 (FIG. 13) formed according to the process described in FIG. 2-FIG. 19.

A die such as one of the dice 2030 is a pattern on a semiconductor wafer such as wafer 2020. A die contains circuitry to perform a specific function. For, example, at least one of the dice 2030 contains circuitry for a device such as a processor, or memory device such as memory device 1100 (FIG. 11-FIG. 19).

Figure 21:
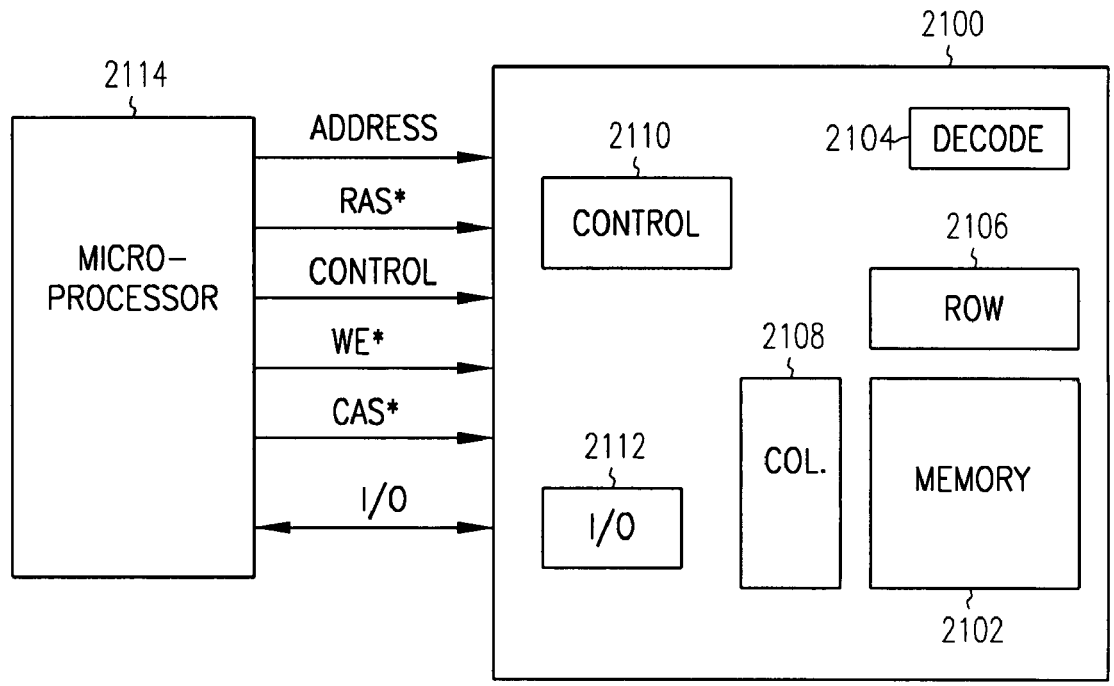
FIG. 21 is a simplified block diagram for an embodiment of a memory device in which an amorphous carbon layer, which is substantially transparent, is employed using an embodiment for an amorphous carbon layer according to the teachings of the present invention.

FIG. 21 is a simplified block diagram of an embodiment of a memory device 2100 in which an amorphous carbon layer, which is substantially transparent, is employed using an embodiment for an amorphous carbon layer according to the teachings of the present invention. In an embodiment, such an amorphous carbon layer is used as a masking structure in the processing of memory device 2100. In an embodiment, such an amorphous carbon layer is used as an insulation layer in a semiconductor structure of memory device 2100. Memory device 2100 includes an array of memory cells 2102, address decoder 2104, row access circuitry 2106 to access a row of the array of memory cells 2102, column access circuitry 2108 to access a column of the array of memory cells 2102, control circuitry 2110 to control internal and external access to memory cells 2102, and input/output (I/O) circuit 2112 to provide transfer of data to and from memory cells 2102 external to memory 2100.

Memory device 2100 is operably coupled to an external microprocessor 2114, or memory controller for memory accessing. Memory device 2100 receives control signals from processor 2114, such as WE*, RAS* and CAS* signals, which can be supplied on a system bus. Memory device 2100 stores data that is accessed via I/O lines. It will be appreciated by those skilled in the art that additional circuitry and control signals can be provided, and that the memory device of FIG. 21 has been simplified to help focus on embodiments of the present invention. At least one of the structures associated with memory device 2100 uses an amorphous carbon layer that is substantially transparent, in accordance with an embodiment of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies. In various embodiments, a memory device may be provided as a packaged integrated circuit. This packaged integrated circuit may be a stand alone memory. The memory device may be provided has one of several packaged integrated circuits on a board. In an embodiment, the memory device may be incorporated in a microprocessor integrated circuit. Alternately, the memory device may also be incorporated in an integrated circuit providing several functionalities other than as a stand alone memory.

Figure 22:
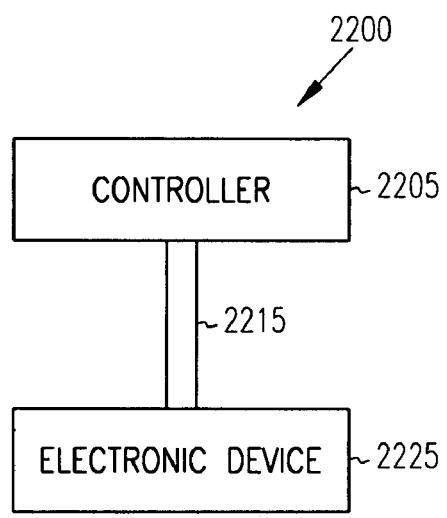
FIG. 22 illustrates a block diagram for an embodiment of an electronic system having devices in which an amorphous carbon layer, which is substantially transparent, is employed using an embodiment for an amorphous carbon layer according to the teachings of the present invention.

FIG. 22 illustrates a block diagram for an embodiment of an electronic system 2200 having devices in which an amorphous carbon layer, which is substantially transparent, is employed using an embodiment for an amorphous carbon layer according to the teachings of the present invention. Electronic system 2200 includes a controller 2205, a bus 2215, and an electronic device 2225, where bus 2215 provides electrical conductivity between controller 2205 and electronic device 2225. In an embodiment, such an amorphous carbon layer is used as a masking structure in the processing of one or more devices of system 2200. In an embodiment, such an amorphous carbon layer is used as an insulation layer in a semiconductor structure of one or more devices of system 2200. In an embodiment, such an amorphous carbon layer is used as an antireflection layer in a semiconductor structure of one or more devices of system 2200. Controller 2205 and/or electronic device 2225 may utilize an amorphous carbon layer, which is substantially transparent, in which the amorphous carbon layer provides a masking structure for controller 2205 and/or electronic device 2225 during processing of these apparatus or is formed as an insulation layer in a semiconductor structure of for controller 2205 and/or electronic device 2225. In an embodiment, electronic system 2200 includes a plurality of electronic devices using an embodiment of an amorphous carbon layer, which is substantially transparent, according to the present invention. Electronic system 2200 may include, but is not limited to, information handling devices, wireless systems, telecommunication systems, fiber optic systems, electro-optic systems, and computers.

In various embodiments, an amorphous carbon layer, which is substantially transparent, for use in a electronic device or for processing an electronic device as described herein may be formed using a process gas containing carbon and a spreading gas. The process gas provides the carbon for the amorphous carbon layer formed, while the spreading gas assists in providing film uniformity for the carbon layer. The process gas includes a carbon-based gas. In an embodiment, the carbon-based gas may include, but is not limited to, one or more carbon containing gases such as $C_3H_6$, $CH_4$, $C_2H_2$, $C_2H_4$, $C_2H_6$, $C_3H_8$, $C_3H_4$, and $C_4H_{10}$. In an embodiment, the process gas includes carbon without oxygen in the gas flow. Having oxygen in the gas flow providing an oxygenating environment may allow the oxygen to burn the carbon out and not form the desired carbon layer. Thus, an embodiment includes a process gas that contains carbon but does not contain substantial oxygen. In various embodiments, the process gas is introduced into a processing system along with a spreading gas.

A spreading gas is a gas that aids in spreading a process gas across a wafer being processed to uniformly grow a material layer. The spreading gas does not substantially interact with the process gas such that a desired carbon layer is formed without substantial residual from the spreading gas included in the amorphous carbon layer. In an embodiment, the spreading gas acts as a carrier gas for the process gas. A carrier gas aids in transporting a process gas through a system to the location at which the process gas interacts based on the parameters of the process being performed. Spreading gases for use in various embodiments include, but are not limited to, one or more of helium, nitrogen, ammonia ($NH_3$), and argon mixed with nitrogen.

In an embodiment, a process gas and a spreading gas are introduced into an RF processing system to form an amorphous carbon layer that is substantially transparent. The RF system may operate at 13.6 megahertz. The RF system configured to operate at 13.6 megahertz may also operate at another frequency, such as a lower frequency, during the same fabrication procedure. Alternately, the RF system may operate at one or more other frequencies. The RF energy provided to the process gas and the spreading gas generates a plasma. The presence of the spreading gas allows the plasma to expand out, thereby spreading over the wafer farther than if the spreading gas were not used. The choice of spreading gas used may also affect parameters other than the uniformity of the amorphous carbon layer deposited in the process.

In an embodiment using nitrogen as a spreading gas, nitrogen improves the plasma properties and deposition rate for the carbon layer such that the carbon film can deposit faster than would occur without the nitrogen. In embodiment for forming a substantially transparent amorphous carbon layer, nitrogen is introduced into an RF process chamber at a flow rate ranging from about 500 sccm to about 3000 sccm, where the flow rate for propylene, $C_3H_6$, as the process gas ranges from about 1000 sccm to about 3000 sccm. The process chamber is at a pressure ranging from about 2.8 Torr to about 7 Torr with the RF power ranging from about 450 watts to about 1000 watts for an electrode spacing ranging from about 190 mils to about 450 mils. The process is performed at a temperature ranging from about 150° C. to about 450° C.

In an embodiment for forming a substantially transparent amorphous carbon layer, helium is used as a spreading gas with $C_3H_6$ as the process gas under the same parameters as nitrogen. The helium is introduced into the RF process chamber at a flow rate ranging from about 200 sccm to about 1500 sccm. In another embodiment, ammonia is used as a spreading gas with $C_3H_6$ as the process gas. The ammonia is introduced into the RF process chamber at a flow rate ranging from about 50 sccm to about 200 sccm. Using ammonia as a spreading gas would reduce the evaporate/deposition properties, but aid in improving uniformity of the amorphous carbon layer.

A substantially transparent amorphous carbon layer formed using a processing gas and a spreading gas can be formed with any thickness depending on the application. In an embodiment, a substantially transparent amorphous carbon layer has a thickness of about 1500 Angstroms. In another embodiment, a substantially transparent amorphous carbon layer has a thickness of about 2000 Angstroms. In other embodiments, a substantially transparent amorphous carbon layer has a thickness of at least 4000 Angstroms. In various embodiments using a processing gas and a spreading gas to form a substantially transparent amorphous carbon layer, the amorphous carbon layer may have a thickness that ranges from about 1000 Angstroms to about 12000 Angstroms.

In various embodiments, an amorphous carbon layer that is substantially transparent is processed using a process gas and a spreading gas at temperatures ranging from about 150° C. to about 450° C. Increased transparency for an amorphous carbon layer is attained at temperatures in the lower end of this temperature range. In an embodiment for processing an electronic device in which various processes other than the formation of a carbon layer is performed at about 375° C., the formation of the carbon layer is also performed at this temperature.

CONCLUSION

Various embodiments of the invention provide techniques to form a transparent amorphous carbon layer. The transparent amorphous carbon layer can be used as a mask for etching certain structure of the device. The amorphous carbon layer can also be a part of a structure of the device for other purposes. In various embodiments, an amorphous carbon layer that is substantially transparent is formed using a process gas containing carbon and a spreading gas to aid in improving the uniformity of the amorphous carbon layer.

It is to be understood that the above description is intended to be illustrative, and not restrictive. Although specific embodiments are described herein, those skilled in the art recognize that other embodiments may be substituted for the specific embodiments shown to achieve the same purpose. Combinations of the above embodiments, and other embodiments, will be apparent to those of skill in the art upon reviewing the above description. The scope of the present invention includes any other applications in which the above structures, fabrication methods, and any adaptations or variations of the present invention are used. The scope of the present invention should be determined with reference to the appended claims, along with the full scope of equivalents to which such claims are entitled.

What is claimed is:

1. An electronic device comprising:
   a semiconductor structure on a substrate; and
   an amorphous carbon layer disposed in the semiconductor structure, the amorphous carbon layer having an extinction coefficient between about 0.001 and about 0.15 at a wavelength of 633 nanometers; and
   a hydrogenated insulating layer disposed on the amorphous carbon layer.

2. The electronic device of claim 1, wherein the electronic device includes an integrated circuit in which the amorphous carbon layer is disposed.

3. The electronic device of claim 1, wherein the amorphous carbon layer is an insulation layer in the semiconductor structure.

4. The electronic device of claim 1, wherein the amorphous carbon layer is an antireflection layer in the semiconductor structure.

5. An electronic device comprising:
   a semiconductor structure on a substrate; and
   an amorphous carbon layer disposed in the semiconductor structure, the amorphous carbon layer having an extinction coefficient between about 0.001 and about 0.15 at a wavelength of 633 nanometers; and
   a hydrogenated insulating layer disposed on the amorphous carbon layer, wherein the amorphous carbon layer is formed by a method including:
     introducing a process gas containing carbon; and
     providing a spreading gas to spread the process gas over a wafer for the semiconductor structure to form the amorphous carbon layer.

6. The electronic device of claim 5, wherein the method further includes forming the amorphous carbon layer at temperatures ranging from about 150° C. to about 500° C.

7. The electronic device of claim 5, wherein introducing a process gas containing carbon includes forming providing one or more gases of $C_3H_6$, $CH_4$, $C_2H_2$, $C_2H_4$, $C_2H_6$, $C_3H_8$, $C_3H_4$, or $C_4H_{10}$.

8. The electronic device of claim 5, wherein introducing a process gas containing carbon includes introducing a process gas containing carbon that does not substantially include oxygen.

9. The electronic device of claim 5, wherein providing a spreading gas includes introducing one or more gases of helium, nitrogen, ammonia, or argon mixed with nitrogen.

10. The electronic device of claim 5, wherein the electronic device includes an integrated circuit.

11. The electronic device of claim 1, wherein the electronic device includes a memory.

12. The electronic device of claim 5, wherein the electronic device is configured to connect to another electronic device in a system.

13. The electronic device of claim 5, wherein the amorphous carbon layer is an insulation layer in the semiconductor structure.

14. The electronic device of claim 5, wherein amorphous carbon layer is an antireflection layer in the semiconductor structure.

15. A memory comprising:
an array of memory cells;
row access circuitry to access a row of the array of memory cells;
column access circuitry to access a column of the array of memory cells;
an input/output circuit to provide transfer of data to and from the array of memory cells; and
control circuitry to control internal and external access to the memory cells, wherein one or more of the memory cells, row access circuitry, colunm access circuitry, input/output circuit, or control circuit has an semiconductor structure with an amorphous carbon layer having an extinction coefficient between about 0.001 and about 0.15 at a wavelength of 633 nanometers and a hydrogenated insulating layer disposed on the amorphous carbon layer.

16. The memory of claim 15, wherein the memory is a packaged integrated circuit.

17. The memory of claim 15, wherein amorphous carbon layer is an insulation layer in the memory.

18. The memory of claim 15, wherein the memory is disposed in an integrated circuit, the integrated circuit configured to provide functionality in addition to that of a stand alone memory.

19. The memory of claim 15, wherein the memory is disposed in a microprocessor integrated circuit.

20. An electronic system comprising:
a controller; and
an electronic device coupled to the controller, wherein at least one of the controller or the electronic device has a semiconductor structure that includes an amorphous carbon layer having an extinction coefficient between about 0.001 and about 0.15 at a wavelength of 633 nanometers and a hydrogenated insulating layer disposed on the amorphous carbon layer.

21. The electronic system of claim 20, wherein the controller is a microprocessor.

22. The electronic system of claim 20, wherein the electronic device is a memory.

23. The electronic system of claim 20, wherein the electronic system is an information handling system.

24. The electronic system of claim 20, wherein the amorphous carbon layer is an insulation layer.

25. The electronic system of claim 20, wherein amorphous carbon layer is an antireflection layer.

26. The electronic device of claim 1, wherein hydrogenated insulating layer includes hydrogenated silicon oxynitride.

27. The electronic device of claim 1, wherein hydrogenated insulating layer includes hydrogenated silicon oxide.

28. The memory of claim 15, wherein hydrogenated insulating layer includes hydrogenated silicon oxynitride.

29. The memory of claim 15, wherein hydrogenated insulating layer includes hydrogenated silicon-rich oxide.

30. The electronic system of claim 20, wherein hydrogenated insulating layer includes hydrogenated silicon oxynitride.

31. The electronic system of claim 20, wherein hydrogenated insulating layer includes hydrogenated silicon oxide.

* * * * *

UNITED STATES PATENT AND TRADEMARK OFFICE
CERTIFICATE OF CORRECTION

PATENT NO. : 7,298,024 B2  
APPLICATION NO. : 11/458642  
DATED : November 20, 2007  
INVENTOR(S) : Yin et al.

Page 1 of 1

It is certified that error appears in the above-identified patent and that said Letters Patent is hereby corrected as shown below:

On the face page, in field (56), under "Other Publications", in column 2, line 2, delete "www," and insert -- www. --, therefor.

In column 15, line 35, in Claim 15, delete "colunm" and insert -- column --, therefor.

Signed and Sealed this

Twenty-ninth Day of April, 2008

JON W. DUDAS  
*Director of the United States Patent and Trademark Office*